(12) United States Patent
Ho et al.

(10) Patent No.: US 7,652,512 B2
(45) Date of Patent: Jan. 26, 2010

(54) CLOCK SYNCHRONIZING CIRCUIT

(75) Inventors: Wen-Chiao Ho, Tainan (TW);
Chin-Hung Chang, Tainan (TW);
Kuen-Long Chang, Taipei (TW);
Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 92 days.

(21) Appl. No.: 12/027,285

(22) Filed: Feb. 7, 2008

(65) Prior Publication Data

US 2009/0201060 A1   Aug. 13, 2009

(51) Int. Cl.
*H03L 7/00* (2006.01)

(52) U.S. Cl. ....................... 327/161; 327/141

(58) Field of Classification Search ........................ None
See application file for complete search history.

(56) References Cited

U.S. PATENT DOCUMENTS

| | | | | |
|---|---|---|---|---|
| 5,955,905 A | * | 9/1999 | Idei et al. ..................... 327/160 |
| 6,049,241 A | * | 4/2000 | Brown et al. ................. 327/295 |
| 6,396,322 B1 | * | 5/2002 | Kim et al. .................... 327/158 |
| 6,449,727 B1 | * | 9/2002 | Toda ........................... 713/401 |
| 6,643,219 B2 | * | 11/2003 | Van De Graaff ....... 365/233.12 |
| 6,933,758 B2 | * | 8/2005 | Kim et al. .................... 327/161 |
| 7,042,799 B2 | * | 5/2006 | Cho ....................... 365/185.17 |
| 7,154,312 B2 | * | 12/2006 | Kim et al. .................... 327/161 |
| 7,375,564 B2 | * | 5/2008 | Cho et al. .................... 327/158 |
| 2004/0145423 A1 | * | 7/2004 | Kirsch .......................... 331/57 |

\* cited by examiner

*Primary Examiner*—Cassandra Cox
(74) *Attorney, Agent, or Firm*—Thomas, Kayden, Horstemeyer & Risley

(57) ABSTRACT

A clock synchronizing circuit applied in a SMD block is provided. The clock synchronizing circuit includes a number of stages of clock synchronizing units. The clock synchronizing circuit can achieve the purpose of clock synchronizing by using a novel circuit design of the forward delay unit, the mirror control unit or the backward delay unit in each stage of clock synchronizing unit or by using a short-pulse generation circuit to generate a short pulse for triggering out an output clock of each stage of forward delay unit.

25 Claims, 24 Drawing Sheets

CLOCK SYNCHRONIZING CIRCUIT

BACKGROUND OF THE INVENTION

1. Field of the Invention

The invention relates in general to a clock synchronizing circuit, and more particularly to a clock synchronizing circuit applied in a synchronous mirror delay (SMD) block.

2. Description of the Related Art

Wide-bandwidth memory systems require increasingly higher capacity and speed in operation. Conventionally, the external clock inputted to the memory system will be registered in an input buffer and processed in a clock driver to generate an internal clock, and the internal clock is a delayed signal of the external clock. In order to improve the memory performance, a clock synchronizing circuit is used to remove the clock skew between the external clock and internal clock.

Conventional phased-locked loop (PLL) and delay-locked loop (DLL) circuits do a good job of suppressing the clock skew. However, they are feedback circuits and require 50 clock cycles or more to achieve locking of the external clock and internal clock, resulting in a large standby current.

Comparatively, the SMD has the fast locking characteristic in recovering from power-down or standby mode within two cycles of the system clock. In other words, the power supply can be turned off completely in standby mode, and the recovery from standby mode can be obtained within a few clocks after power setting time.

FIG. 1A and FIG. 2 are respectively a block diagram of a conventional SMD block and a timing diagram of the relevant clocks in operation of the SMD block in FIG. 1A. As shown in FIG. 1A and FIG. 2, a SMD block 100 includes a delay monitor circuit (DMC) 102, forward delay array (FDA) 104, mirror control circuit (MCC) 106 and backward delay array (BDA) 108. Each of the FDA 104, MCC 106 and BDA 108 includes a number of stages of delay units (not shown in the figure). An external clock ECLK is first inputted to an input buffer 110, and delayed by a time d1 to output a clock A. The DMC 102 of the SMD block 100 then receives the clock A and delays the clock A by a time (d1+d2) to generate a clock B. Following that, the FDA 104 receives the clock B and delays the clock B to generate a clock Cn at the n-th stage of delay unit.

Next, the MCC 106 triggers out a clock Dn with a negative pulse at the n-th stage of delay unit according to the clocks A and Cn, and the clock Dn is delayed by a time tv relative to the clock B. Afterward, the BDA 108 receives the clock Dn, delays the clock Dn by the time tv to generate a clock E and converts the clock E to a clock F with a positive pulse. Finally, the clock F is outputted to a clock driver 120 and delayed by a time d2 through the clock driver 120 to generate an internal clock ICLK.

Totally, the internal clock ICLK will be delayed by a time (d1+(d1+d2)+tv+tv+d2)=2(d1+d2+tv) relative to the external clock ECLK. If the time tv is equal to (Tk−d1−d2), wherein Tk is a clock period of the external clock ECLK, the delay time of the internal clock ICLK will be twice the clock period Tk. Consequently, as shown in FIG. 2, the internal clock ICLK will synchronize the external clock ECLK during the third clock of the external clock ECLK. However, the above-mentioned SMD block 100 has the following issues.

(1) As shown in FIG. 1B, it is an example of the prior art SMD circuit in FIG. 1A. Since the signal Dn is the NAND2 result of the signals A and Cn, this will result in the condition as FIG. 3, the duty cycle td2 of the internal clock ICLK may not be the same as the duty cycle td1 of the external clock ECLK even the rising edge of the internal clock ICLK can synchronize the rising edge of the external clock ECLK. This will lead to an error operation in a double data rate (DDR) application since DDR will output data during both rising edge and falling edge.

(2) As shown in FIG. 4, the second rising edge of the clock A is supposed to generate a negative pulse Dn_1 of the clock Dn and start to propagate the negative pulse Dn_1 through the BDA 108. However, an unnecessary negative pulse Dn_0 might be also generated if the duty cycle td1 of the external clock ECLK is large. The unnecessary negative pulse Dn_0 will be propagated earlier and the function of the SMD block 100 will be failed.

(3) Assume that there are some circuit of MCC can solve the issue of FIG. 2, in other words, the signal Dn can have the same clock period as the signal A or Cn, there still have the other issue, for example, there are three delay units in the MCC 106 generating negative pulses Dn−1, Dn and Dn+1 as shown in FIG. 5. These three negative pulses Dn−1, Dn and Dn+1 will propagate until the last stage. However, since every stage of delay units in the BDA 108 will have delay, and this will result in an extension of the negative pulse of the clock E. As shown in FIG. 5, the negative pulse En of the clock E is the combination of the negative pulses Dn and En+1, and as a result, the pulse width pll of the negative pulse En−1 will be larger than the pulse width plh of the clock A. Similar to the first issue, this pulse extension will lead to an error operation in the DDR application.

(4) For example, each delay unit of the FDA 104 includes a NAND2 gate 610 and an inverter 620, while each delay unit of the BDA 108 includes a NAND2 gate 630 and an inverter 640 as shown in FIG. 6A and FIG. 6B. The NAND2 gate 610 of the n-th stage of delay unit outputs a clock Yn1 according to the clock Dn−2 (or VDD) and the clock Cn−1. The NAND2 gate 630 of the n-th stage of delay unit outputs a clock Yn2 according to the clocks Dn and En+1. The inverters 620 and 640 respectively output clocks Cn and En according to the clocks Yn1 and Yn2. The clock Dn−2 (or VDD) and the clock Dn are both at a high level. The clock Cn−1 has a high level while the clock En+1 has a low level as shown in FIG. 6C.

Thus, as shown in FIGS. 6A~6C, the delay time tdr of the clock Cn relative to the clock Cn−1 is a sum of the gate delay of two serial-connected N-type metal oxide semiconductor (NMOS) transistors M2 and M3 and one P-type metal oxide semiconductor (PMOS) transistor M4, while the delay time tdf of the clock En relative to the clock En+1 is a sum of the gate delay of one PMOS transistor M1 and one NMOS transistor M5. Thus, the delay time tdr will not be equal to the delay time tdf. The difference of one delay unit might not be huge. However, a lot of delay units will accumulate a significant difference between the delay time of the clock Dn relative to the clock B and the delay time of the clock E relative to the clock Dn since the clock period will need a lot of delay units to propagate.

(5) As shown in FIG. 7, the propagating time t-pos of the positive pulse, i.e. the delay time of the clock Cn relative to the clock B, is the same as the propagating time t-neg of the negative pulse, i.e. the delay time of the clock E relative to the clock Dn. However, when the positive pulse of the clock Cn has a non-trivial pulse width, the rising edge of the positive pulse of the clock Cn will occur by a delay time t-miss relative to the falling edge of the negative pulse of the clock E as triggered by the clock A. As a result, the delay time tv of the clock Dn relative to the clock B is (t-pos+t-miss)=Tk−d1−d2, and the total delay time of the internal clock ICLK relative to the external clock ECLK is (d1+(d1+d2)+tv+t-neg+d2)=2

(Tk−t-miss). Therefore, the purpose of synchronizing the internal clock ICLK and external clock ECLK cannot be achieved.

SUMMARY OF THE INVENTION

The invention is directed to a clock synchronizing circuit applied in a SMD block. By using a novel design of the FDA, MCC or BDA, or a short-pulse generation circuit in the clock synchronizing circuit, the above issues can be effectively resolved.

According to a first aspect of the present invention, a clock synchronizing circuit is provided. The clock synchronizing circuit is applied in a SMD block for receiving an input clock. The clock synchronizing circuit includes a plurality of stages of clock synchronizing units. Each of the clock synchronizing units is used for outputting an output clock according to the input clock and an output clock of a next stage of clock synchronizing unit. Each clock synchronizing unit includes a forward delay unit, a mirror control unit and a backward delay unit. The forward delay unit is for outputting a first delayed clock according to the first delayed clock of a previous stage of forward delay unit. The mirror control unit is coupled to the forward delay unit, for outputting a mirror clock according to the input clock and the first delayed clock. The mirror control unit includes a first mirror-control device, a second mirror-control device and a third mirror-control device. The first mirror-control device is for outputting a first mirror-controlled clock according to the input clock. The second mirror-control device is for outputting a second mirror-controlled clock according to the first delayed clock. The third mirror-control device is coupled to the first mirror-control device and the second mirror-control device for outputting the mirror clock according to the input clock, the first mirror-controlled clock and the second mirror-controlled clock. The backward delay unit is coupled to the mirror control unit for delaying the mirror clock to the corresponding output clock.

In a first timing period when the input clock has a first level and the first delayed clock has a second level, the first mirror-controlled clock has the second level, the second mirror-controlled clock has the first level and the mirror clock has the second level; in a second timing period when both of the input clock and the first delayed clock have the second level, all of the first mirror-controlled clock, the second mirror-controlled clock and the mirror clock have the first level; in a third timing period when the input clock has the second level and the first delayed clock has the first level, the first mirror-controlled clock has the first level, the second mirror-controlled clock has the second level and the mirror clock has the first level; in a fourth timing period when both of the input clock and the first delayed clock have the first level, all of the first mirror-controlled clock, the second mirror-controlled clock and the mirror clock have the second level.

According to a second aspect of the present invention, a clock synchronizing circuit is provided. The clock synchronizing circuit is applied in a SMD block for receiving an input clock. The clock synchronizing circuit includes a plurality of stages of clock synchronizing units, and each of the clock synchronizing units is used for outputting an output clock according to the input clock and an output clock of a next stage of clock synchronizing unit. Each clock synchronizing unit includes a forward delay unit, a mirror control unit and a backward delay unit. The forward delay unit is for outputting a first delayed clock according to the first delayed clock of a previous stage of forward delay unit. The forward delay unit includes a first forward-delay device and a second forward-delay device. The first forward-delay device is for delaying the first delayed clock of the previous stage of forward delay unit to a forward-delayed clock by a first delay time. The second forward-delay device is coupled to the first forward-delay device for delaying the forward-delayed clock to the first delayed clock by a second delay time.

The mirror control unit is coupled to the second forward-delay device for outputting a mirror clock according to the input clock and the first delayed clock. The backward delay unit is coupled to the mirror control unit for outputting the corresponding output clock according to the mirror clock. The backward delay unit includes a first backward-delay device and a second backward-delay device. The first backward-delay device is for delaying the mirror clock to a backward-delayed clock by a third delay time, wherein the third delay time is substantially equal to the second delay time. The second backward-delay device is coupled to the first backward-delay device for delaying the backward-delayed clock to the corresponding output clock by a fourth delay time, wherein the fourth delay time is substantially equal to the first delay time.

According to a third aspect of the present invention, a clock synchronizing circuit is provided. The clock synchronizing circuit is applied in a SMD block for receiving an input clock. The clock synchronizing circuit includes a plurality of clock synchronizing units, and each of the clock synchronizing units is used for outputting an output clock according to the input clock and an output clock of a next stage of clock synchronizing unit. Each clock synchronizing unit includes a forward delay unit, a mirror control unit and a backward delay unit. The forward delay unit is for outputting a first delayed clock according to the first delayed clock of a previous stage of forward delay unit. The forward delay unit includes a forward-delay device and a first NAND2 gate. The forward-delay device is for delaying the first delayed clock of the previous stage of forward delay unit to a forward-delayed clock. The first NAND2 gate is coupled to the forward-delay device for outputting the first delayed clock according to the forward-delayed clock.

The mirror control unit is coupled to the first NAND2 gate for outputting a mirror clock according to the input clock and the first delayed clock. The backward delay unit is coupled to the mirror control unit for outputting the corresponding output clock according to the mirror clock. The backward delay unit includes a first backward-delay device, a second backward-delay device and a second NAND2 gate. The first backward-delay device is for delaying the mirror clock to a backward-delayed clock. The second backward-delay device is for delaying a phase of the mirror clock of a previous stage of mirror control unit to generate a stop signal. The second NAND2 gate is coupled to the first backward-delay device for outputting the corresponding output clock according to the backward-delayed clock and the stop signal.

According to a fourth aspect of the present invention, a clock synchronizing circuit is provided. The clock synchronizing circuit is applied in a SMD block for receiving an input clock. The clock synchronizing circuit includes a short-pulse generation circuit and a plurality of stages of clock synchronizing units. The short-pulse generation circuit is for outputting a short-pulse clock according to the input clock, wherein the pulse-width of the short-pulse clock is much smaller than the pulse-width of the input clock. Each of the clock synchronizing units is used for outputting an output clock according to the input clock and an output clock of a next stage of clock synchronizing unit. The first stage of clock synchronizing unit receives the short-pulse clock. Each clock synchronizing unit includes a forward delay unit, a mirror control unit and a backward delay unit. The forward delay unit is for outputting a first delayed clock according to the first delayed clock of a previous stage of forward delay unit. The mirror control unit is coupled to the forward delay unit, for outputting a mirror clock according to the input clock and the first delayed clock. The backward delay unit is coupled to the mirror control unit for delaying the mirror clock to the corresponding output clock.

The invention will become apparent from the following detailed description of the preferred but non-limiting embodiments. The following description is made with reference to the accompanying drawings.

DETAILED DESCRIPTION OF THE INVENTION

The invention is directed to a clock synchronizing circuit applied in the SMD block, which can effectively help to synchronize the internal clock and the external clock within a few cycles of the system clock. Four embodiments will be taken for illustrating how the clock synchronizing circuit of the invention resolves the prior-art issues of the SMD block in the following description.

Embodiment One

Figure 1A:
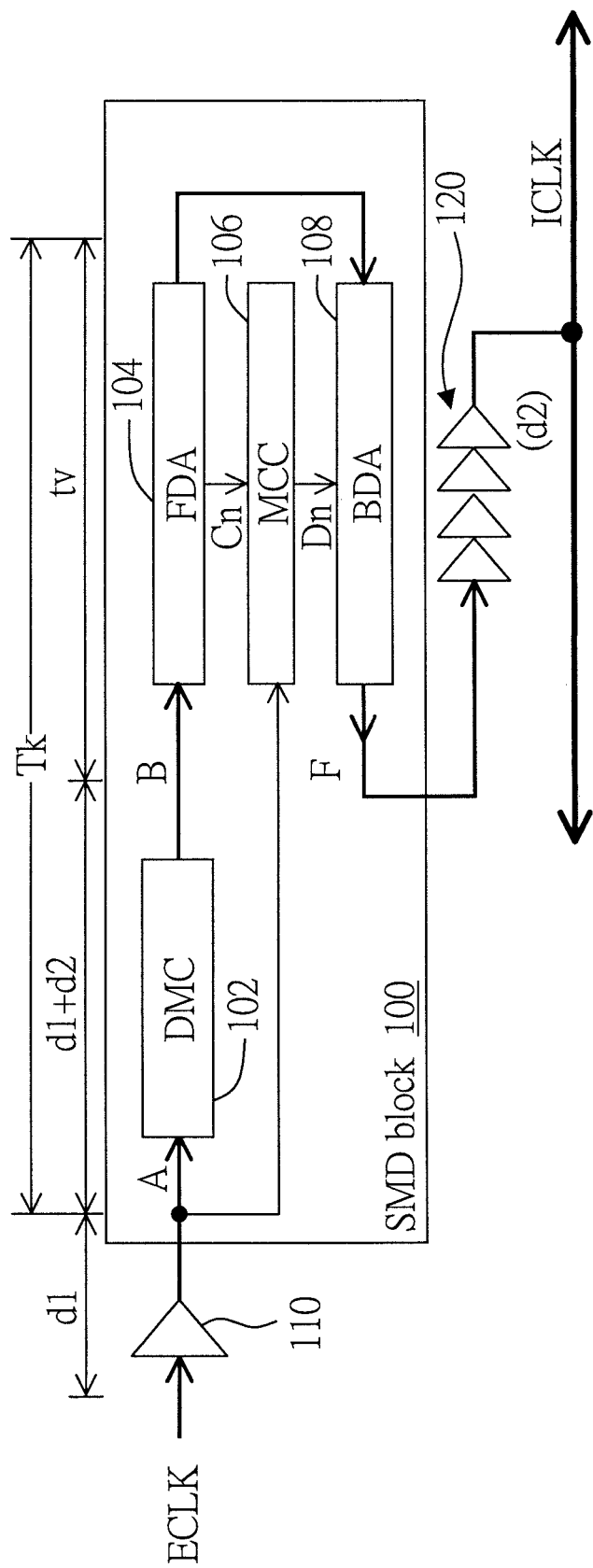
FIG. 1A (Prior Art) is a block diagram of a conventional SMD block.
Figure 1B:
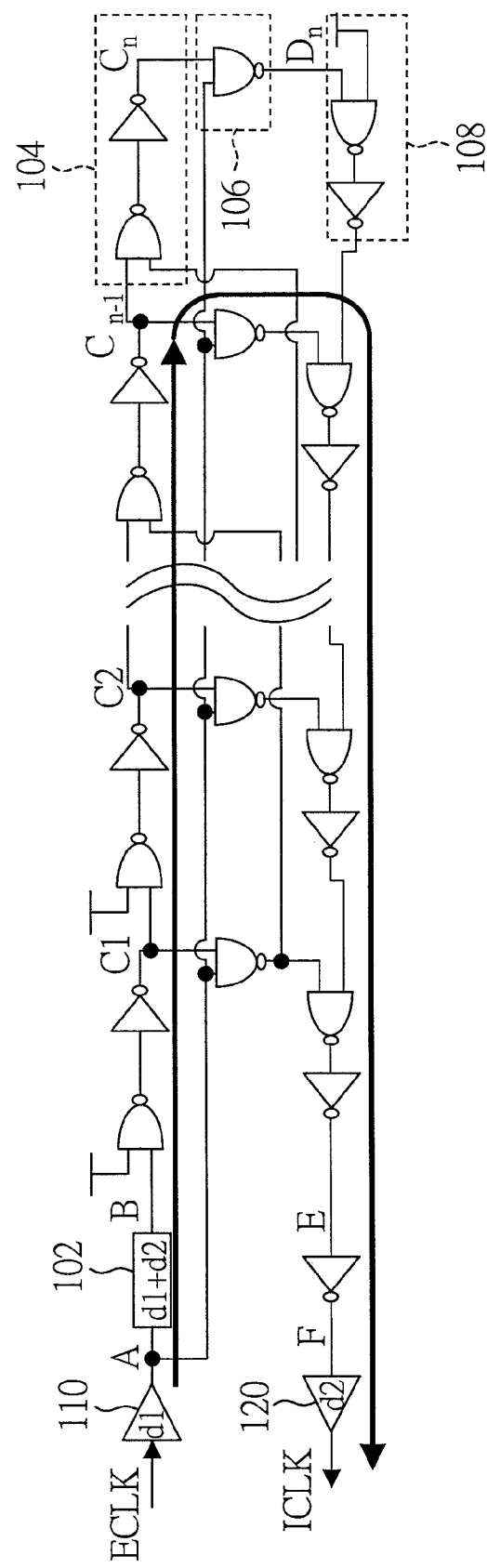
FIG. 1B (Prior Art) is a diagram of the SMD circuit in FIG. 1A.
Figure 2:
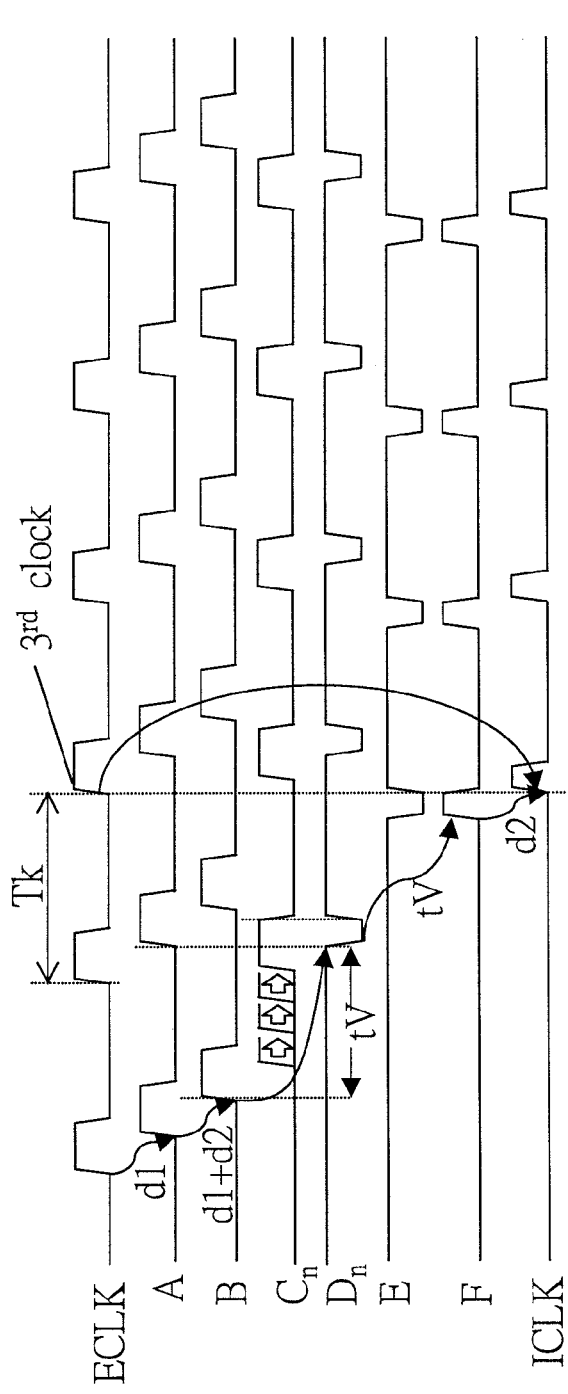
FIG. 2 (Prior Art) is a timing diagram of the relevant clocks in operation of the SMD block in FIG. 1A.
Figure 3:
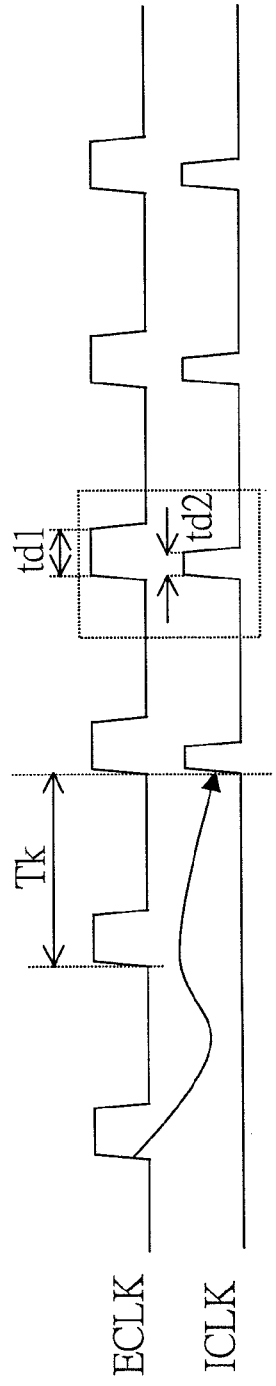
FIG. 3 (Prior Art) is a timing diagram of the clocks ECLK and ICLK with different duty cycles in the SMD block of FIG. 1A.
Figure 4:
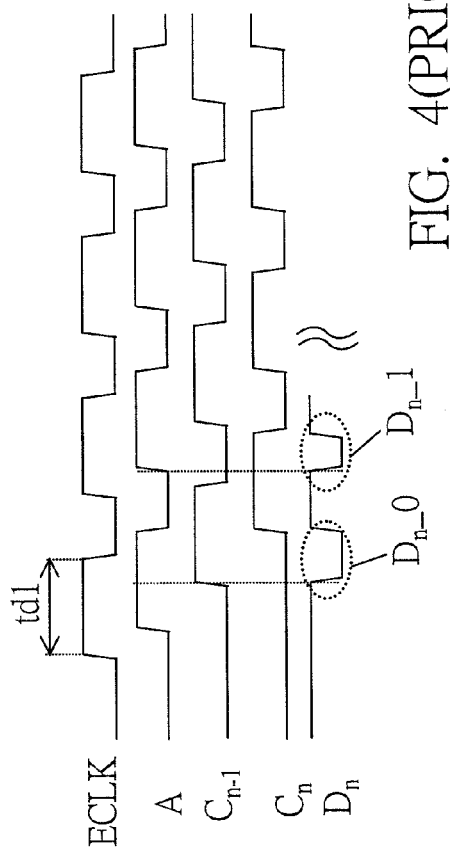
FIG. 4 (Prior Art) is a timing diagram showing an unnecessary negative pulse is generated in the mirror clock of the MCC in FIG. 1A.
Figure 5:
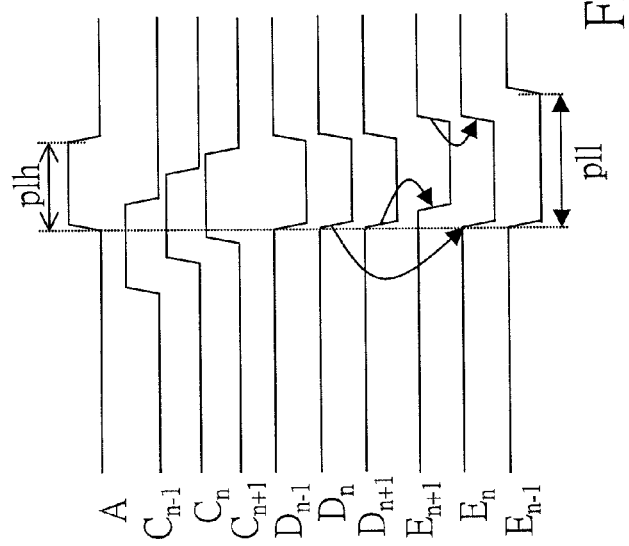
FIG. 5 (Prior Art) is a timing diagram showing negative pulse extension of the output clock of the BDA in FIG. 1A.
Figure 6B:
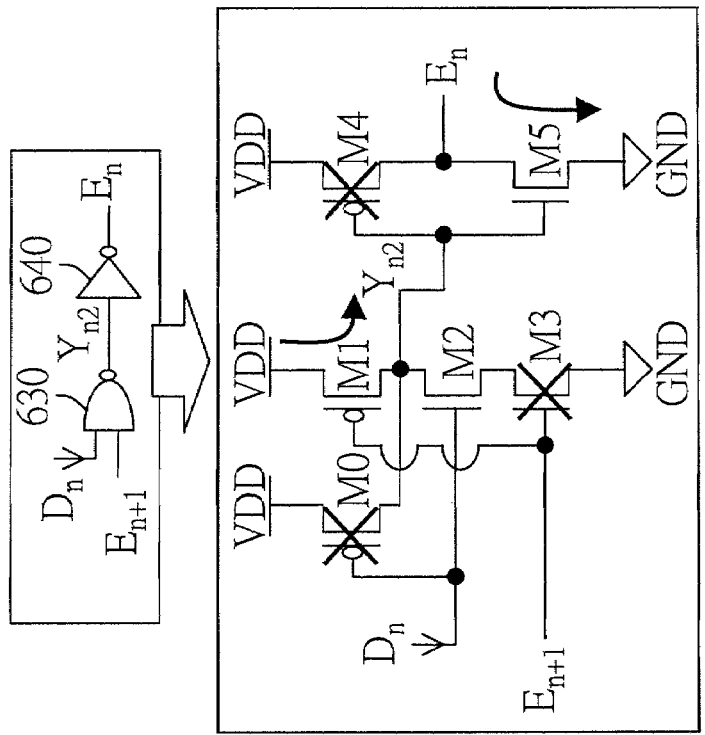
FIG. 6B (Prior Art) is a circuit diagram of the on/off states of transistors in the delay unit of the BDA in FIG. 1A.
Figure 6A:
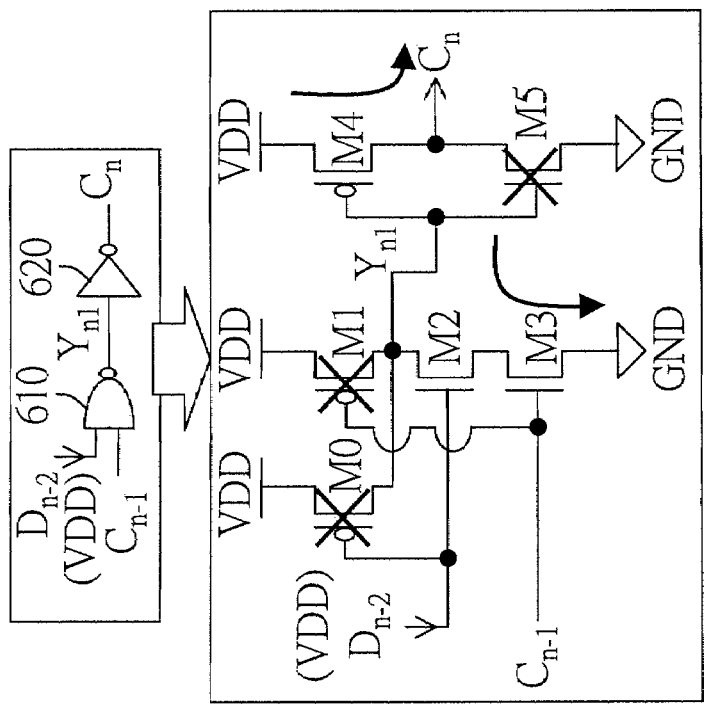
FIG. 6A (Prior Art) is a circuit diagram of the on/off states of transistors in the delay unit of the FDA in FIG. 1A.
Figure 6C:
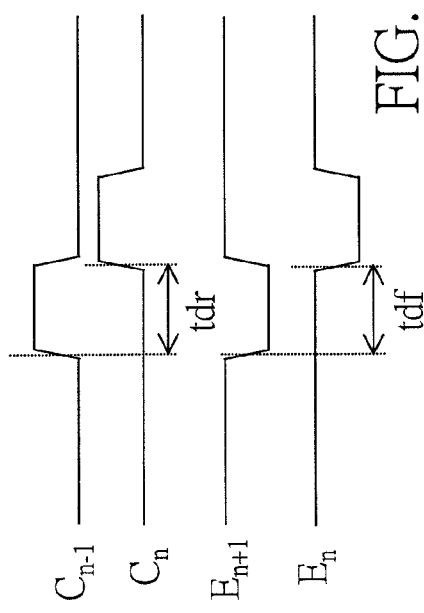
FIG. 6C (Prior Art) is a timing diagram of the clocks Cn−1, Cn, En+1, En in the FDA and BDA of FIG. 1A.
Figure 7:
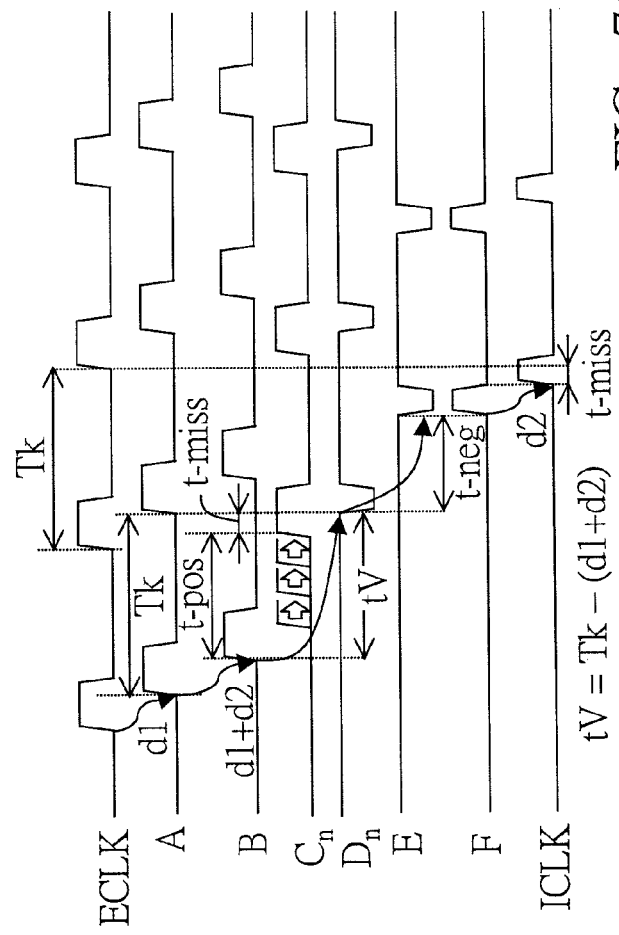
FIG. 7 (Prior Art) is a timing diagram of the clocks ECLK, A, B, Cn, Dn, E, F and ICLK in the SMD block of FIG. 1A.
Figure 8:
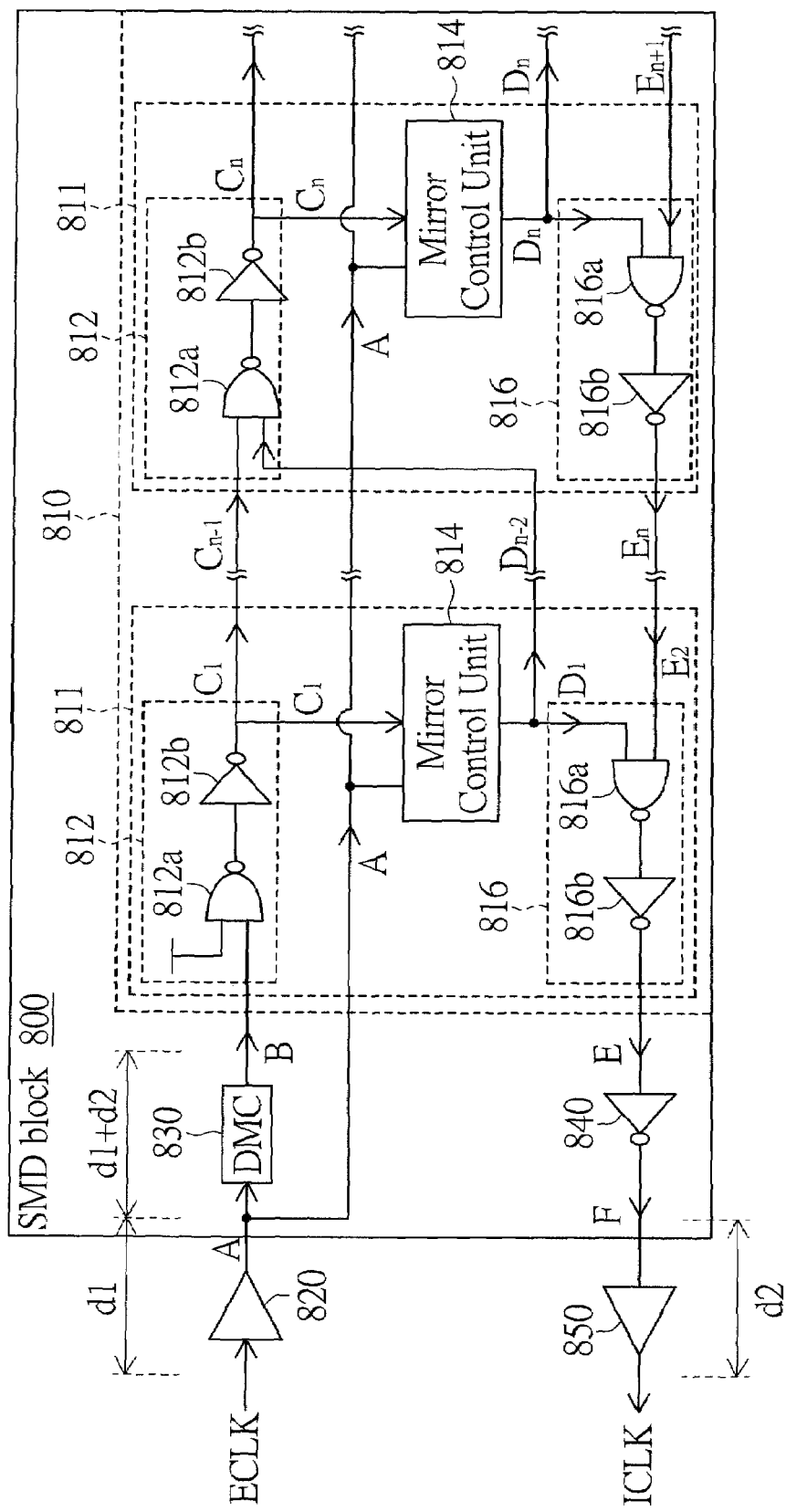
FIG. 8 is a block diagram of a clock synchronizing circuit applied in a SMD block according to the first embodiment of the invention.
Figure 9:
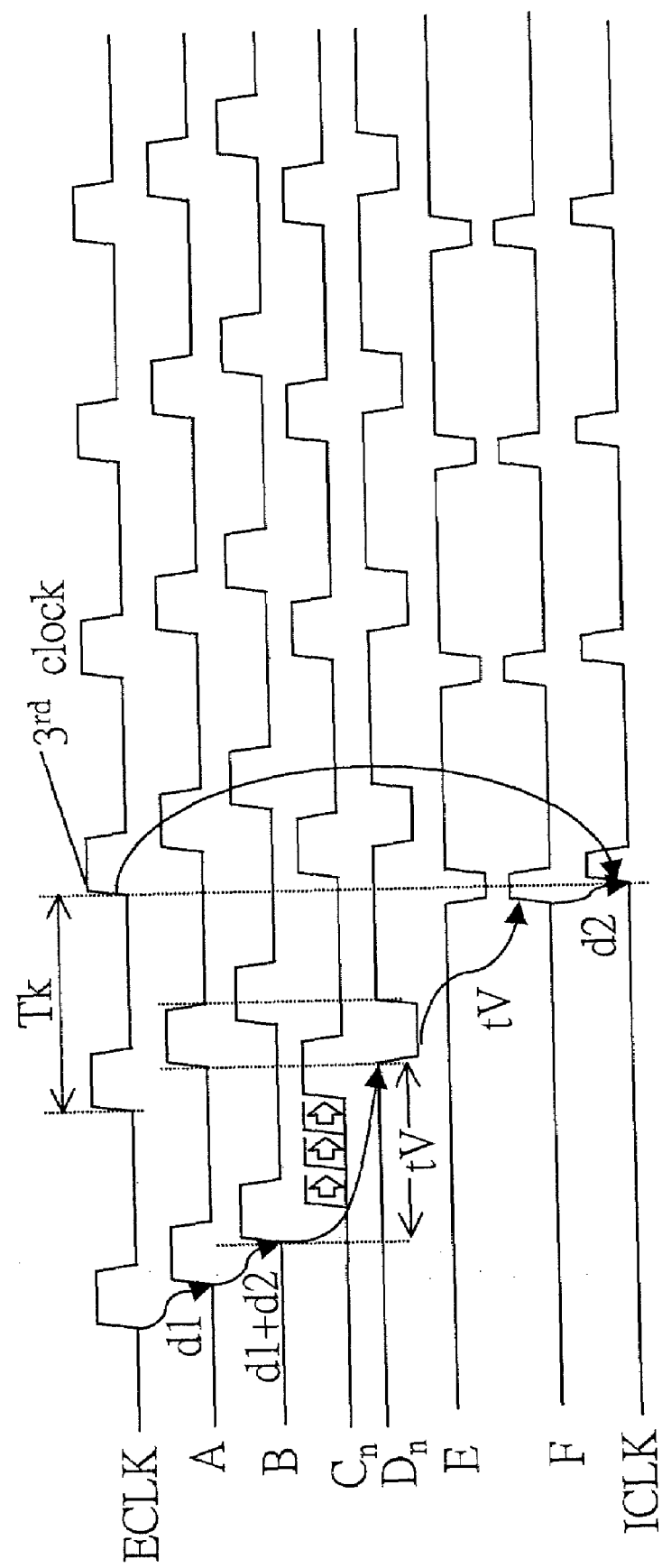
FIG. 9 is a timing diagram of the relevant clocks in operation of the SMD block of FIG. 8.

Referring to FIG. 8 and FIG. 9, a block diagram of a clock synchronizing circuit applied in a SMD block according to the first embodiment of the invention and a timing diagram of the relevant clocks in operation of the SMD block of FIG. 8 are shown respectively. A clock synchronizing circuit 810 is applied in a SMD block 800 of a memory system for receiving an input clock A from an input buffer 820. The input buffer 820 outputs the clock A by a delay time d1 according to an external clock ECLK, and a DMC 830 of the SMD block 800 delays the clock A by a delay time (d1+d2) to generate a clock B. The clock synchronizing circuit 810 includes a number of stages of clock synchronizing units 811. The n-th stage of clock synchronizing unit 811 is used for outputting an output clock En according to the input clock A and an output clock En+1 of the (n+1)-th stage of clock synchronizing unit 811, wherein n is a natural number. The first stage of clock synchronizing unit 811 receives the clocks A, B and outputs a clock E, which is further converted to a clock F through an inverter 840. The clock F is then inputted to a clock driver 850 and delayed by a time d2 to generate an internal clock ICLK.

Each stage of clock synchronizing unit 811 includes a forward delay unit 812, a mirror control unit 814 and a backward delay unit 816. The n-th stage of forward delay unit 812 is for delaying the output clock Cn−1 of the previous stage of forward delay unit 812 to generate a first delayed clock Cn, wherein the first stage of forward delay unit 812 delays the clock B to the clock C1. For example, the forward delay unit 812 includes a NAND2 gate 812a and an inverter 812b. In the n-th stage of forward delay unit 812, the NAND2 gate 812a receives the output clock Cn−1 of the (n−1)-th stage of forward delay unit 812 and an output clock Dn−2 of the (n−2)-th stage of mirror control unit 814, and the inverter 812b outputs the first delayed clock Cn according to an output clock of the NAND2 gate 812a.

The n-th stage of mirror control unit 814 is coupled to the n-th stage of forward delay unit 812 for outputting a mirror clock Dn with a negative pulse according to the input clock A and the first delayed clock Cn. The mirror clock Dn is delayed by a time tv relative to the clock B. Once the level of the clock Dn goes low (i.e. "0"), the NAND2 gate 812a of the (n+2)-th stage of forward delay unit 812 outputs a clock with a high level (i.e. "1") according to the high-level clock Cn+1 ("1") and the low-level clock Dn ("0"), and the inverter 812b outputs the clock Cn+2 with a low level (GND) according to the high-level clock outputted by the NAND2 gate 812a. In other words, the clock Cn+2 will be stopped generating the positive pulse as the level of the clock Dn goes low.

The n-th stage of backward delay unit 816 is connected to the n-th stage of mirror control unit 814 for delaying the mirror clock Dn of the mirror control unit 814 to generate a clock En, wherein the first stage of backward delay unit 816 outputs the clock E. For example, the backward delay unit 816 includes a NAND2 gate 816a and an inverter 816b. In the n-th stage of backward delay unit 816, the NAND2 gate 816a receives the mirror clock Dn of the mirror control unit 814 and the output clock En+1 of the (n+1)-th stage of backward delay unit 816, and the inverter 816b outputs the output clock En according to an output clock of the NAND2 gate 816a. As a result, the delay time of the output clock E relative to the clock Dn is also the time tv.

When the time tv is controlled to be (Tk-d1-d2), wherein Tk is a clock period of the external clock ECLK, the internal clock ICLK will be delayed by the time (d1+(d1+d2)+tv+tv+d2)=2(d1+d2+tv)=2Tk relative to the external clock ECLK.

Figure 10:
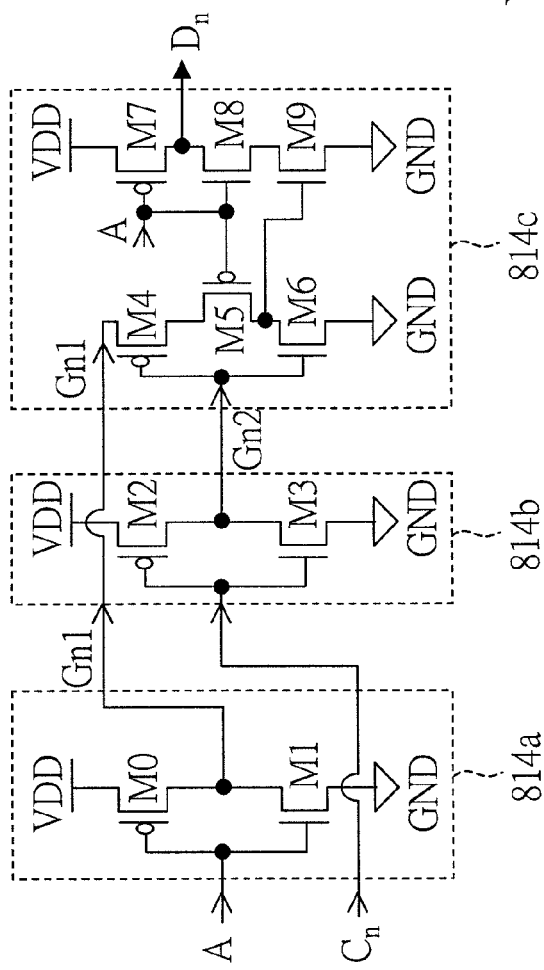
FIG. 10 is a circuit diagram of the n-th stage of mirror control unit of FIG. 8.

Referring to FIG. 10, a circuit diagram of the n-th stage of mirror control unit 814 of FIG. 8 is shown. The n-th stage of mirror control unit 814 includes a first mirror-control device 814a, a second mirror-control device 814b and a third mirror-control device 814c. The first mirror-control device 814a, such as a first inverter including a PMOS transistor M0 and an NMOS transistor M1, is for outputting a first mirror-controlled clock Gn1 according to the input clock A. The second mirror-control device 814b, such as a second inverter including a PMOS transistor M2 and an NMOS transistor M3, is for outputting a second mirror-controlled clock Gn2 according to the first delayed clock Cn. The third mirror-control device 814c is coupled to the first mirror-control device 814a and the second mirror-control device 814b for outputting the mirror clock Dn according to the first mirror-controlled clock Gn1 and the second mirror-controlled clock Gn2.

For example, as shown in FIG. 10, the third mirror-control device 814c includes a first MOS transistor M4, a second MOS transistor M6, a third MOS transistor M5, a fourth MOS transistor M7, a fifth MOS transistor M8 and a sixth MOS transistor M9. The first MOS transistor M4, such as a PMOS transistor, has a gate receiving the second mirror-controlled clock Gn2 and a source receiving the first mirror-controlled clock Gn1. The second MOS transistor M6, such as a NMOS transistor, has a gate connected to the gate of the first MOS transistor M4 and a source grounded.

The third MOS transistor M5, such as a PMOS transistor, has a source connected to a drain of the first MOS transistor M4 and a drain connected to a drain of the second MOS transistor M6. The fourth MOS transistor M7, such as a PMOS transistor, has a gate connected to a gate of the third MOS transistor M5 for receiving the input clock A, a source connected to an operational voltage VDD and a drain for outputting the mirror clock Dn. The fifth MOS transistor M8, such as a NMOS transistor, has a gate connected to the gate of the third MOS transistor M5 and a drain connected to the drain of the fourth MOS transistor M7. The sixth MOS transistor M9, such as a NMOS transistor, has a gate connected to the drain of the second MOS transistor M6, a drain connected to a source of the fifth MOS transistor M8 and a source grounded.

Figure 11:
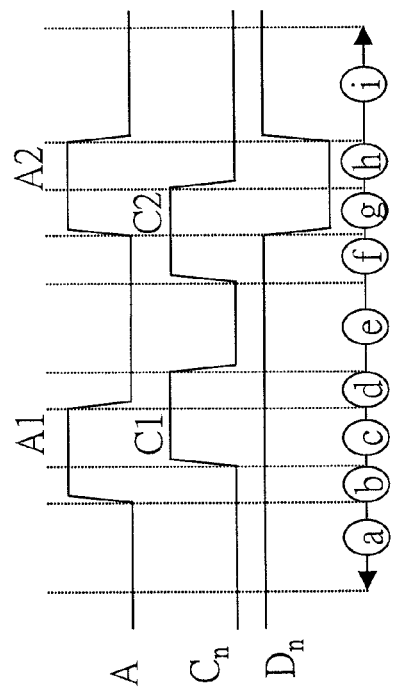
FIG. 11 is a timing diagram of the clocks A, Cn and Dn of the mirror control unit in FIG. 10.

Referring to FIG. 11, a timing diagram of the clocks A, Cn and Dn of the mirror control unit 814 in FIG. 10 is shown. The feature of the embodiment lies in an unnecessary negative pulse will not be triggered out by the first pulse A1 of the input clock A and the negative pulse of the mirror clock Dn triggered out by the second pulse A2 of the input clock A has the rising edge and falling edge at the same time as those of the second pulse A2 in order to resolve the first and second prior-art issues.

In the first stage when the first pulse A1 and a first pulse C1 of the clock Cn are successively generated, no negative pulse of the clock Dn is triggered. In a first timing period (a) of the first stage, as shown in FIG. 11 and FIG. 12A, before the first pulse A1 is generated, both of the clocks A and Cn have a first level, such as a low level GND. The transistor M0 is turned on, the transistor M1 is turned off, and thus the clock Gn1 has a high level VDD. The transistor M2 is turned on, the transistor M3 is turned off, and thus the clock Gn2 has the high level VDD. At the time, the transistor M4 is turned off, the transistors M5 and M7 are turned on by the clock A (GND), and the transistor M6 is turned on by the clock Gn2 (VDD). The transistor M9 is turned off for the gate voltage of the transistor M9 is grounded by the turned-on transistor M6 and the transistor M8 is turned off by the clock A. As a result, the clock Dn is charged to VDD (a second level) by the transistor M7.

Figure 12B:
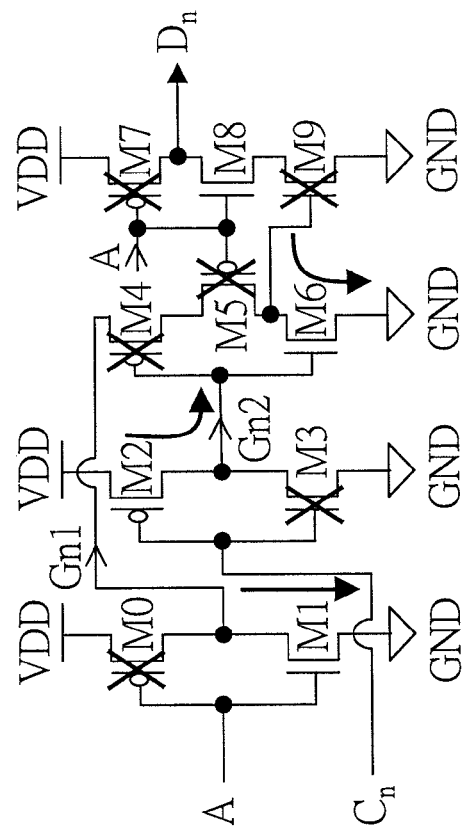
FIGS. 12B~12G are circuit diagrams of the on/off states of transistors in the mirror control unit of FIG. 8 in timing periods (b), (c), (d, (f), (g) and (h).
Figure 12A:
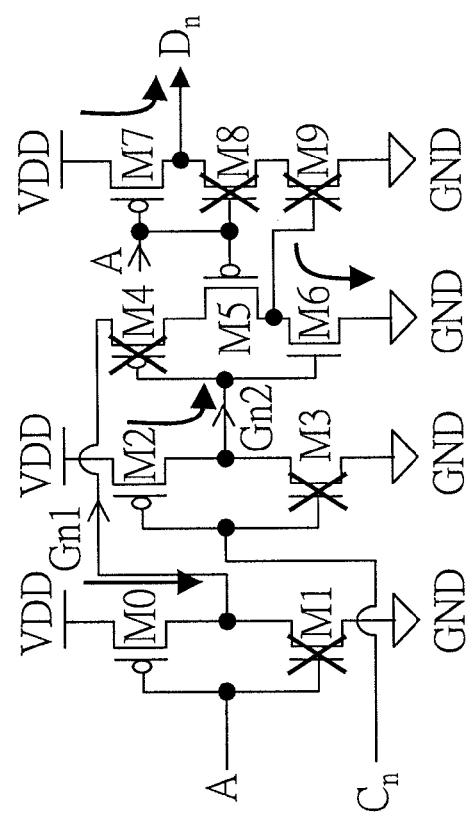
FIG. 12A is a circuit diagram of the on/off states of transistors in the mirror control unit of FIG. 8 in the timing periods (a), (e) and (i).

In a second timing period (b) of the first stage, as the first pulse A1 is generated, as shown in FIG. 11 and FIG. 12B, the clock A changes to have a second level, such as the high level VDD, and the clock Cn keeps at the first level (GND). The transistor M0 is turned off, the transistor M1 is turned on, and thus the clock Gn1 has the low level GND. The transistor M2 is turned on, the transistor M3 is turned off, and thus the clock Gn2 has the high level VDD. At the time, the transistor M4 is turned off, the transistors M5 and M7 are turned off by the clock A (VDD), and the transistor M6 is turned on by the clock Gn2 (VDD). The transistor M9 is turned off for the gate voltage of the transistor M9 is grounded by the turned-on transistor M6 and the transistor M8 is turned on by the clock A. As a result, the clock Dn will be floating and keep at the previous level VDD.

Figure 12D:
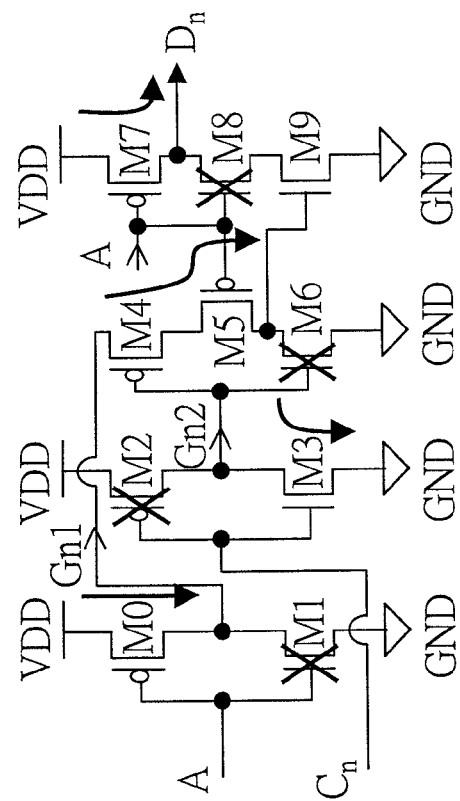
Figure 12C:
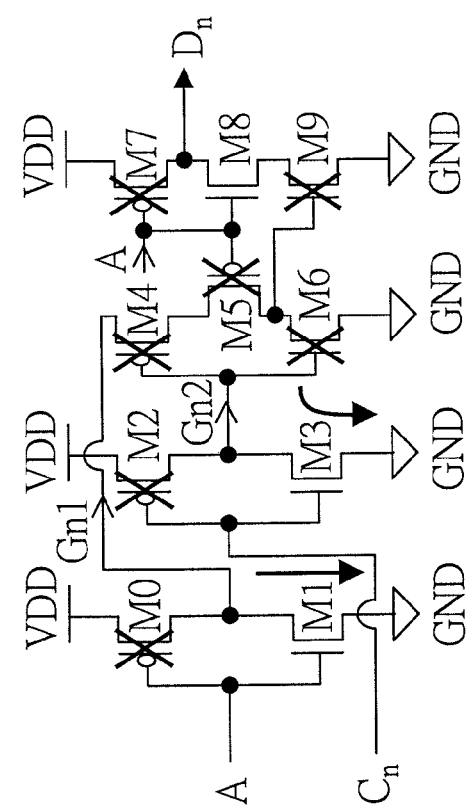

In a third timing period (c) of the first stage, as shown in FIG. 11 and FIG. 12C, the input clock A keeps at the second level (VDD), and the clock Cn changes to the second level (VDD). The transistor M0 is turned off, the transistor M1 is turned on, and thus the clock Gn1 has the low level GND. The transistor M2 is also turned off, the transistor M3 is turned on, and thus the clock Gn2 has the low level GND. At the time, the transistor M4 is turned off, the transistors M5 and M7 are turned off by the clock A (VDD), and the transistor M6 is turned off by the clock Gn2 (GND). The transistor M9 is turned off for the gate voltage of the transistor M9 is floating and keeps at the previous level GND and the transistor M8 is turned on by the clock A. As a result, the clock Dn will be floating and keep at the previous level VDD.

In a fourth timing period (d) of the first stage, as shown in FIG. 11 and FIG. 12D, the input clock A changes to the first level (GND), and the clock Cn keeps at the second level (VDD). The transistor M0 is turned on, the transistor M1 is turned off, and thus the clock Gn1 has the high level VDD. The transistor M2 is turned off, the transistor M3 is turned on, and thus the clock Gn2 has the low level GND. At the time, the transistor M4 is turned on, the transistors M5 and M7 are also turned on by the clock A (GND), and the transistor M6 is turned off by the clock Gn2 (GND). The transistor M9 is turned on for the gate voltage of the transistor M9 is lifted up to the high level VDD by the turned-on transistors M4 and M5, and the transistor M8 is turned off by the clock A. As a result, the clock Dn will be charged to VDD by the transistor M7.

In a fifth timing period (e) of the first stage, as shown in FIG. 11, both of the clocks A and Cn have the first level (GND). All the transistors M0-M9 have the same operation as those in the timing period (a), and thus the clock Dn is charged to VDD by the transistor M7 as shown in FIG. 12A.

Figure 12E:
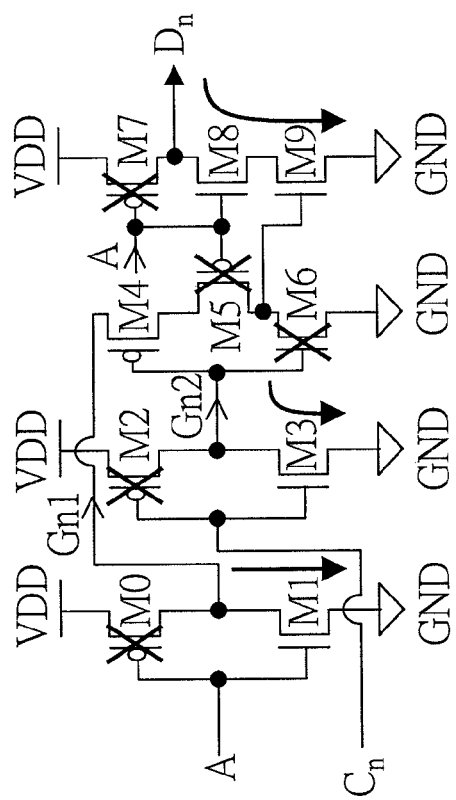

In the following second stage, a second pulse C2 of the clock Cn is generated, and the negative pulse will be triggered out by the second pulse A2 of the clock A. In a first timing period (f) of the second stage, as shown in FIG. 11 and FIG. 12E, the clock A has the first level (GND) and the clock Cn has the second level (VDD). The transistor M0 is turned on, the transistor M1 is turned off, and thus the clock Gn1 has the high level VDD. The transistor M2 is turned off, the transistor M3 is turned on, and thus the clock Gn2 has the low level GND. At the time, the transistor M4 is turned on, the transistors M5 and M7 are turned on by the clock A (GND), and the transistor M6 is turned off by the clock Gn2 (GND). The transistor M9 is turned on for the gate voltage of the transistor M9 is lifted up to the high level VDD by the turned-on transistors M4 and M5, and the transistor M8 is turned off by the clock A. As a result, the clock Dn will be charged to VDD by the transistor M7.

Figure 12F:
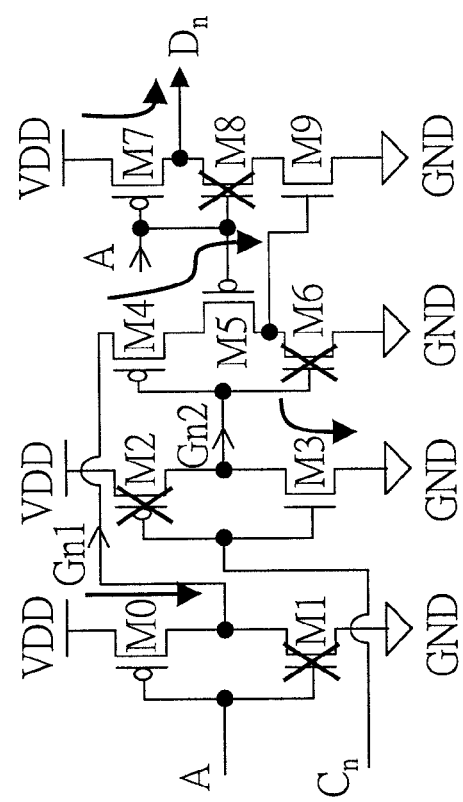

In a second timing period (g) of the second stage, as shown in FIG. 11 and FIG. 12F, both of the clocks A and Cn have the second level (VDD). The transistor M0 is turned off, the transistor M1 is turned on, and thus the clock Gn1 has the low level GND. The transistor M2 is turned off, the transistor M3 is turned on, and thus the clock Gn2 has also the low level GND. At the time, the transistor M4 is turned on, the transistors M5 and M7 are turned off by the clock A (VDD), and the transistor M6 is turned off by the clock Gn2 (GND). The transistor M9 is turned on for the gate voltage of the transistor M9 is floating and keeps at the previous level VDD, and the transistor M8 is turned on by the clock A. As a result, the clock Dn will be discharged to GND while the clock A goes high.

Figure 12G:
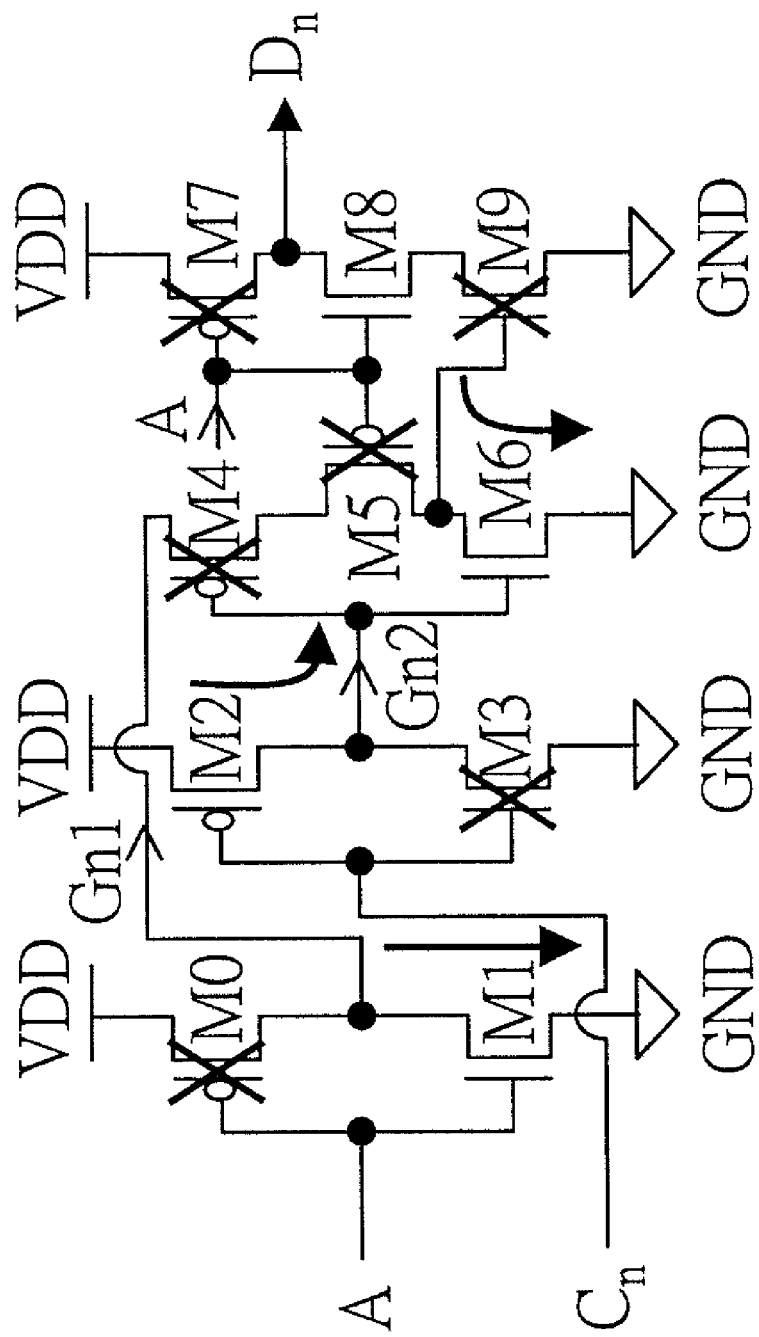

In a third timing period (h) of the second stage, as shown in FIG. 11 and FIG. 12G, the input clock A has the second level (VDD) and the clock Gn1 has the first level (GND). The transistor M0 is turned off, the transistor M1 is turned on, and thus the clock Gn1 has the low level GND. The transistor M2 is turned on, the transistor M3 is turned off, and thus the clock Gn2 has the high level VDD. At the time, the transistor M4 is turned off, the transistors M5 and M7 are turned off by the clock A (VDD), and the transistor M6 is turned on by the clock Gn2 (VDD). The transistor M9 is turned off for the gate voltage of the transistor M9 is grounded through the turned-on transistor M6, and the transistor M8 is turned on by the clock A. As a result, the clock Dn will be floating and keep at the previous level GND.

In a fourth timing period (i) of the second stage, as shown in FIG. 11, both of the clocks A and Cn have the first level (GND). The transistors M0-M9 have the same operation as those in the timing periods (a) and (e) of the first stage, and thus clock Dn is charged to VDD by the transistor M7 as shown in FIG. 12A.

Therefore, by using the mirror control unit 814 incorporated with the forward delay unit 812, the clock synchronizing unit 811 can generate the required mirror clock Dn as triggered by the input clock A, and the rising and falling edges of the mirror clock Dn synchronize those of the input clock A as shown in FIG. 9. As a result, the internal clock ICLK has the same duty cycle as the external clock ECLK, and thus the above-mentioned error operation of the conventional SMD block in the DDR application can be prevented.

Embodiment Two

Figure 13:
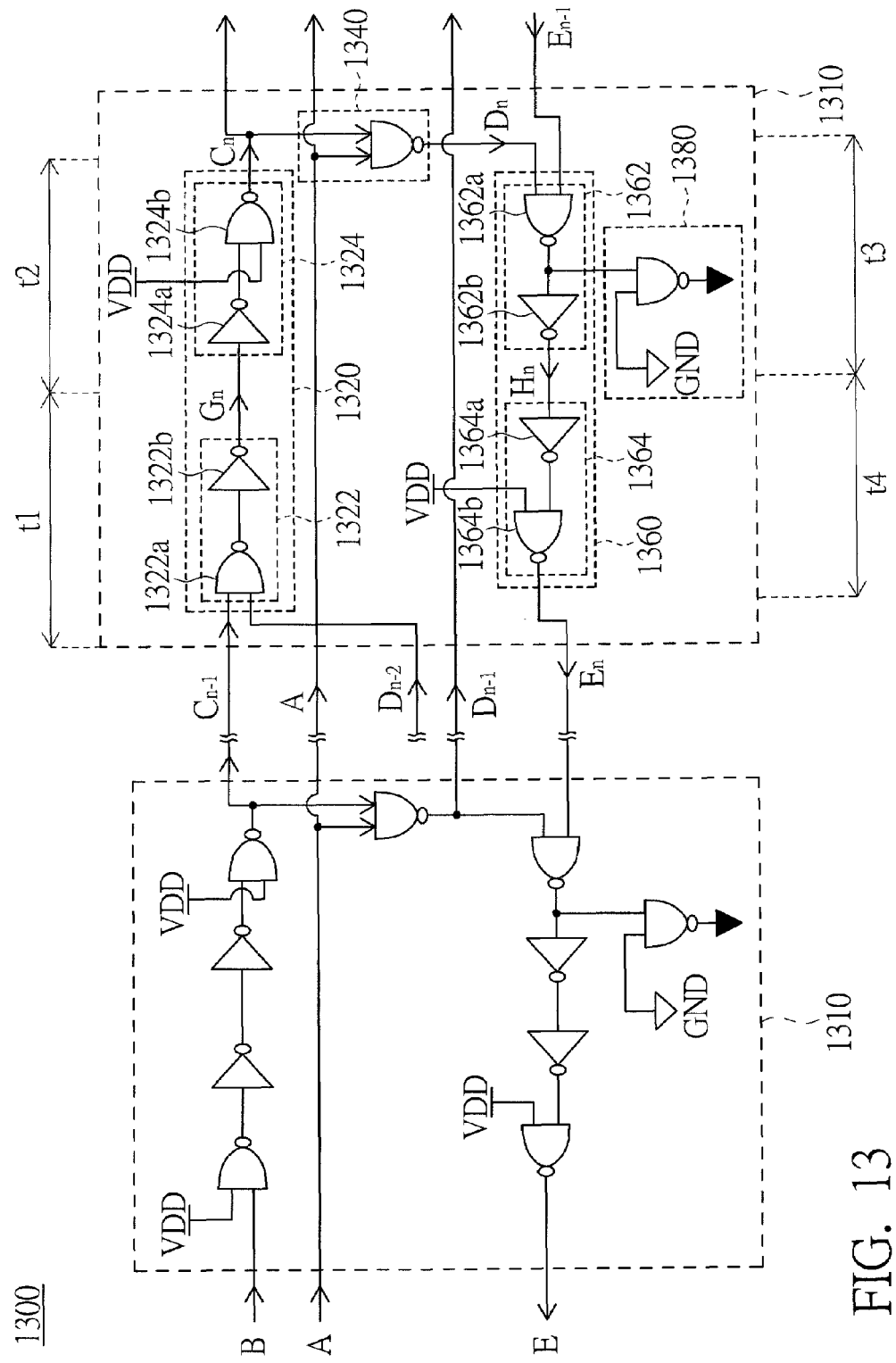
FIG. 13 is a block diagram of a clock synchronizing circuit according to the second embodiment of the invention.

Referring to FIG. 13, a block diagram of a clock synchronizing circuit according to the second embodiment of the invention is shown. The clock synchronizing circuit 1300 is applied in a SMD block for receiving an input clock A. The input clock A is inputted to a DMC (not shown in the figure) of the SMD block to generate a clock B. The clock synchronizing circuit 1300 includes a number of stages of clock synchronizing units 1310. The n-th stage of clock synchronizing units 1310 is used for outputting an output clock En according to the input clock A and an output clock En+1 of the (n+1)-th stage of clock synchronizing unit 1310, wherein n is a natural number. The first stage of clock synchronizing unit 1310 receives the clocks A, B and outputs an output clock E. Each clock synchronizing unit 1310 includes a forward delay unit 1320, a mirror control unit 1340, a backward delay unit 1360 and a dummy unit 1380.

The n-th stage of forward delay unit 1320 is for outputting a first delayed clock Cn according to the output clock Cn−1 of the (n−1)-th stage of clock synchronizing unit 1310, wherein the first stage of forward delay unit 1320 outputs the first delayed clock C1 according to the clock B. The forward delay unit 1320 includes a first forward-delay device 1322 and a second forward-delay device 1324. The first forward-delay device 1322 is for delaying the first delayed clock Cn−1 to a forward-delayed clock Gn by a first delay time t1. The second forward-delay device 1324 is coupled to the first forward-delay device 1322 for delaying the forward-delayed clock Gn to the first delayed clock Cn by a second delay time t2.

For example, the first forward-delay device 1322 includes a first NAND2 gate 1322a for receiving the clocks Cn−1 and Dn−2, and a first inverter 1322b connected to an output terminal of the first NAND2 gate 1322a for outputting the clock Gn. The second forward-delay device 1324 includes a second inverter 1324a connected to an output terminal of the first inverter 1322b and a second NAND2 gate 1324b connected to an output terminal of the second inverter 1324a and an operational voltage VDD for outputting the first delayed clock Cn.

The n-th stage of mirror control unit 1340, such as an NAND2 gate, is coupled to the n-th stage of second forward-delay device 1324 for outputting the mirror clock Dn according to the input clock A and the first delayed clock Cn. Once the level of the clock Dn goes low (i.e. "0"), the NAND2 gate 1322a of the (n+2)-th stage of forward delay unit 1324 outputs a clock with a high level (i.e. "1") according to the high-level clock Cn+1 ("1") and the low-level clock Dn ("0"), and the inverter 1324b outputs the clock Cn+2 with a low level (GND) according to the high-level clock outputted by the inverter 1324a. In other words, the clock Cn+2 will be stopped generating the positive pulse as the level of the clock Dn goes low.

The n-th stage of backward delay unit 1360 is coupled to the n-th stage of mirror control unit 1340 for outputting the corresponding output clock En according to the mirror clock Dn and the output clock En+1 of the next stage of backward delay unit 1360. The backward delay unit 1360 includes a first backward-delay device 1362 and a second backward-delay device 1364. The first backward-delay device 1362 is for delaying the clock En+1 to a backward-delayed clock Hn by a third delay time t3. The second backward-delay device 1364 is coupled to the first backward-delay device 1362 for delaying the backward-delayed clock Hn to the corresponding output clock En by a fourth delay time t4.

For example, the first backward-delay device 1362 includes a third NAND2 gate 1362a for receiving the mirror clock Dn and the clock En+1, and a third inverter 1362b connected to an output terminal of the third NAND2 gate 1362a for outputting the clock Hn. The second backward-delay device 1364 includes a fourth inverter 1364a connected to an output terminal of the third converter 1362b and a fourth NAND2 gate 1364b connected to an output terminal of the fourth converter 1364a and the operational voltage VDD for outputting the corresponding output clock En. It can be seen from FIG. 13 that the first forward-delay device 1322 and the second forward-delay device 1324 are connected to each other in a stagger type and the first backward-delay device 1362 and the second backward-delay device 1364 are connected to each other in a stagger type. The dummy unit 1380 is a NAND2 gate connected to the NAND2 gate 1362 for loading match.

Figure 14A:
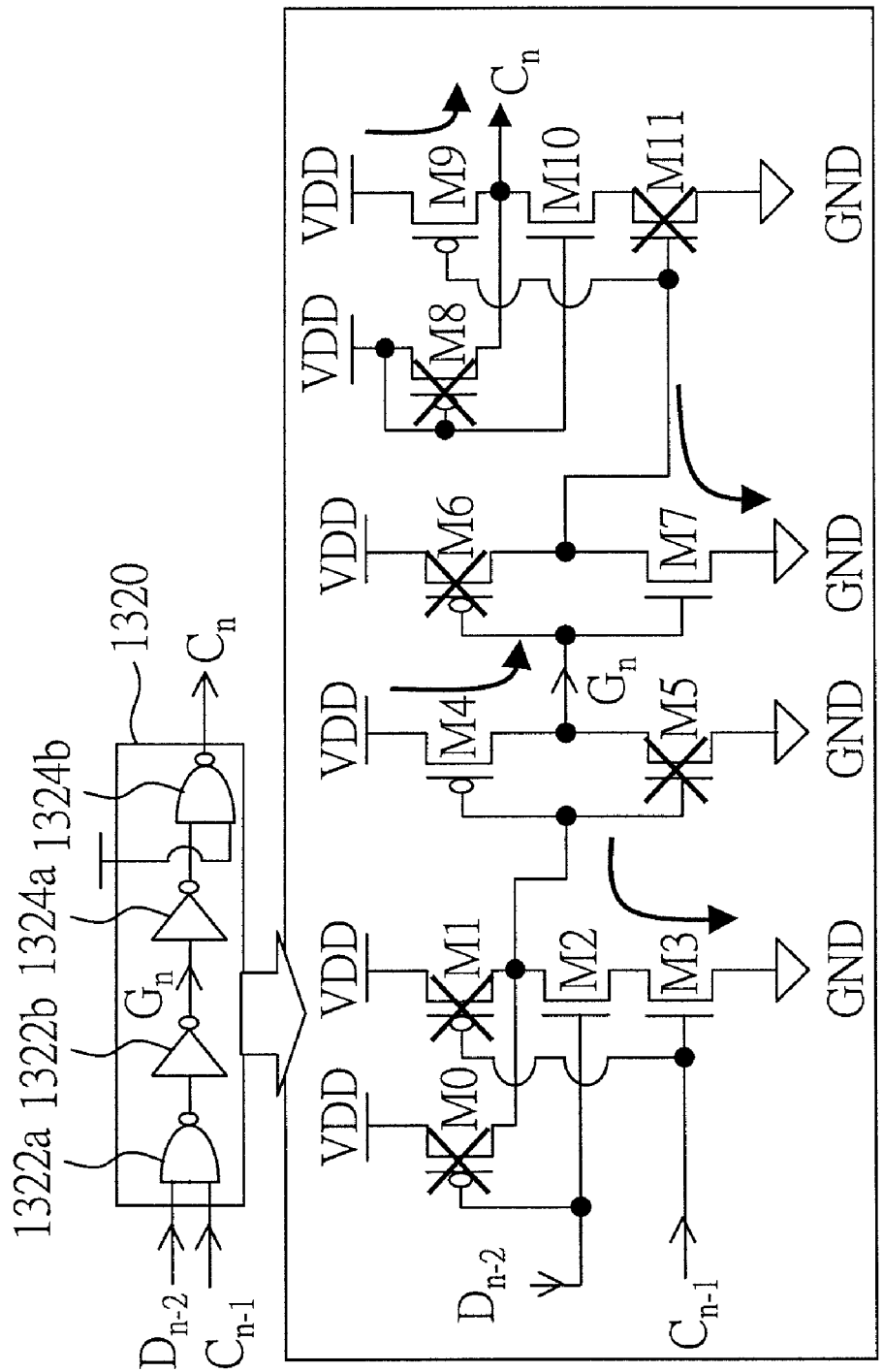
FIG. 14A is a circuit diagram of the on/off states of transistors in the forward delay unit of FIG. 13 in propagation of the positive pulse.
Figure 14B:
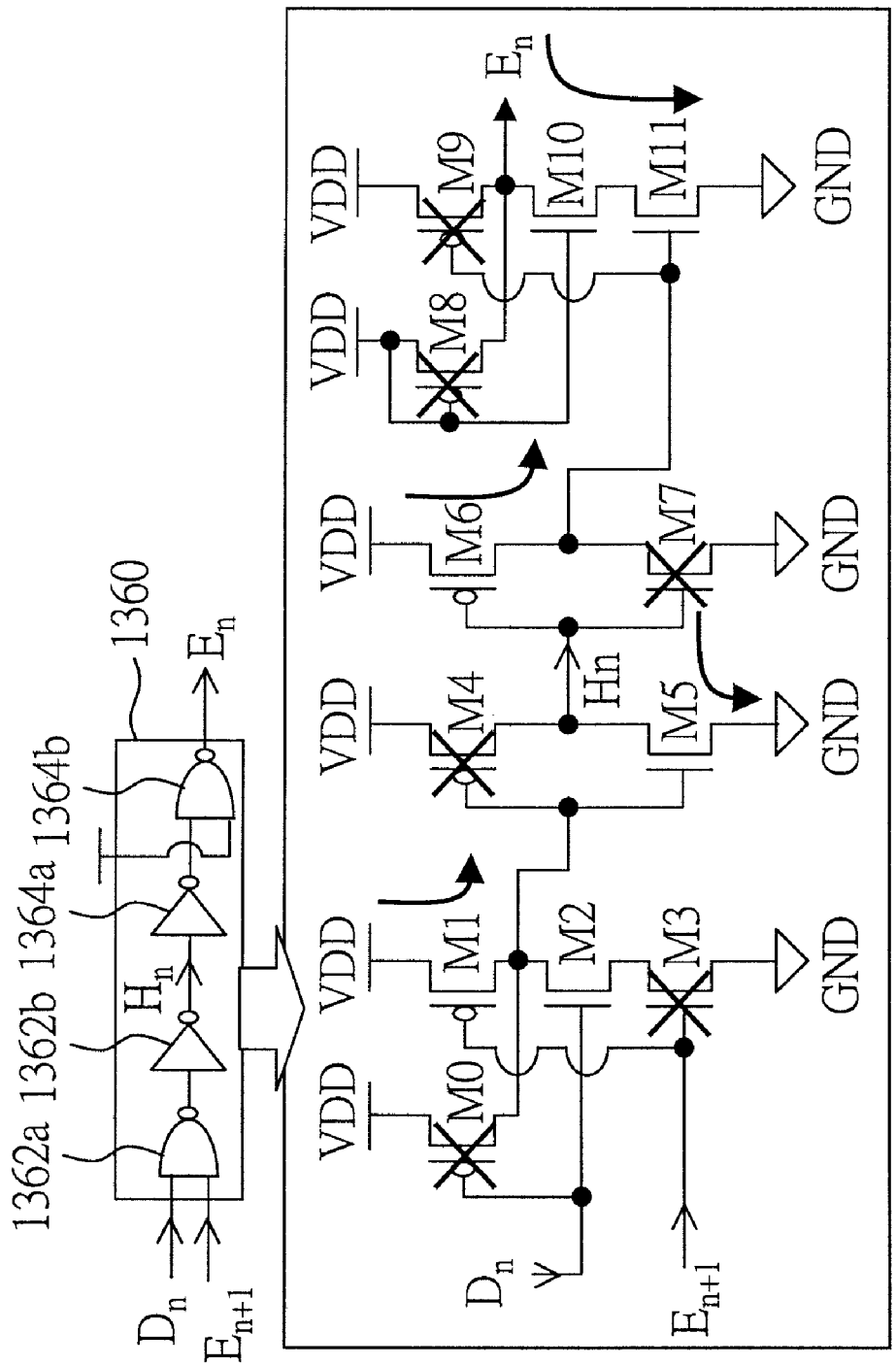
FIG. 14B is a circuit diagram of the on/off states of transistors in the backward delay unit of FIG. 13 in propagation of the negative pulse.

Referring to FIGS. 14A and 14B, circuit diagrams of the on/off states of transistors in the forward delay unit 1320 and the backward delay unit 1360 of FIG. 13 in propagation of the positive pulse and the negative pulse are respectively shown. In the propagation of positive pulse, as shown in FIG. 14A, the clock Cn−1 goes high from a low level, the clock Dn−2 has the high level, the PMOS transistors M0 and M1 are turned off, the NMOS transistors M2 and M3 are turned on, and thus the NAND2 gate 1322a outputs the voltage GND. The PMOS transistor M4 is turned on, the NMOS transistor M5 is turned off and thus the output clock Gn of the inverter 1322b is at the high level VDD. The PMOS transistor M6 is turned off, the NMOS transistor M7 is turned on, and thus the inverter 1324a outputs the voltage GND.

In the propagation of negative pulse, the clock En+1 goes low from a high level, and the clock Dn has the high level. The PMOS transistor M0 and NMOS transistor M3 are turned off, the PMOS transistor M1 and NMOS transistor M2 are turned on, and thus the NAND2 gate 1362a outputs the high level VDD. The PMOS transistors M4 is turned off, the NMOS transistor M5 is turned on, and thus the output clock Hn of the inverter 1362b has the voltage GND. The PMOS transistor M6 is turned on, the NMOS transistor M7 is turned off, and thus the inverter 1364a outputs the high level VDD. The PMOS transistors M8 and M9 are turned off, the NMOS transistors M10 and M11 are turned on, and thus the clock En is at the low level GND. Therefore, the delay time t3 of the clock Hn relative to the clock En+1 is a sum of gate delay of one PMOS transistor M1 and one NMOS transistor M5. The delay time t4 of the clock En relative to the clock Hn is a sum of gate delay of the 2 serial-connected NMOS transistors M10 and M11 and one PMOS transistor M6.

Therefore, the delay time t3 is equal to the delay time t2, i.e. t3=t2, and the delay time t4 is equal to the delay time t1, i.e. t4=t1. The delay time (t1+t2) of the clock Cn relative to the clock Cn−1 is the same as the delay time (t3+t4) of the clock En relative to the clock En+1. As a result, the fourth prior-art issue of having difference between the delay time of the clock Dn relative to the clock B (propagation time of the positive pulse) and the delay time of the clock E relative to the clock Dn (propagation time of the negative pulse) can be resolved to achieve the purpose of clock synchronizing.

Although the first forward-delay device 1322 is exemplified to include the first NAND2 gate 1322a and the first inverter 1322b, the second forward-delay device 1324 is exemplified to include the second inverter 1324a and the second NAND2 gate 1324b, the first backward-delay device 1362 is exemplified to include the third NAND2 gate 1362a and the third inverter 1362b, the second backward-delay device 1364 is exemplified to include the fourth inverter 1364a and the fourth NAND2 gate 1364b in the second embodiment, the invention is not limited thereto.

Figure 15A:
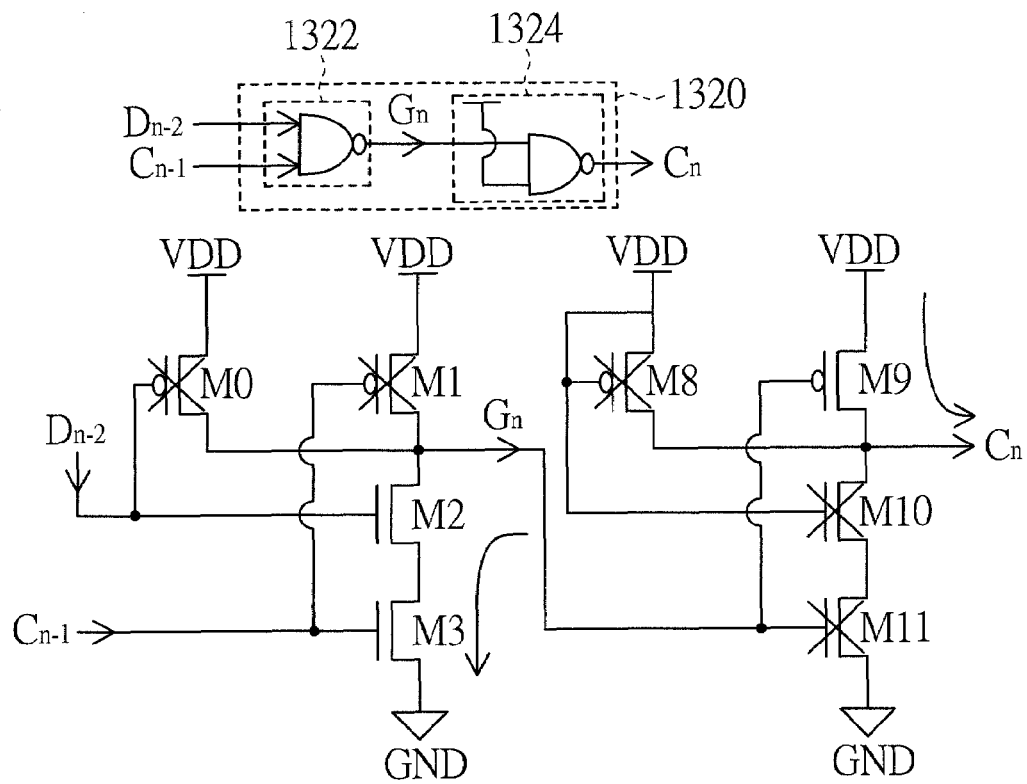
FIG. 15A is another example of the forward delay unit and the on/off states of transistors thereof in propagation of the positive pulse.
Figure 15B:
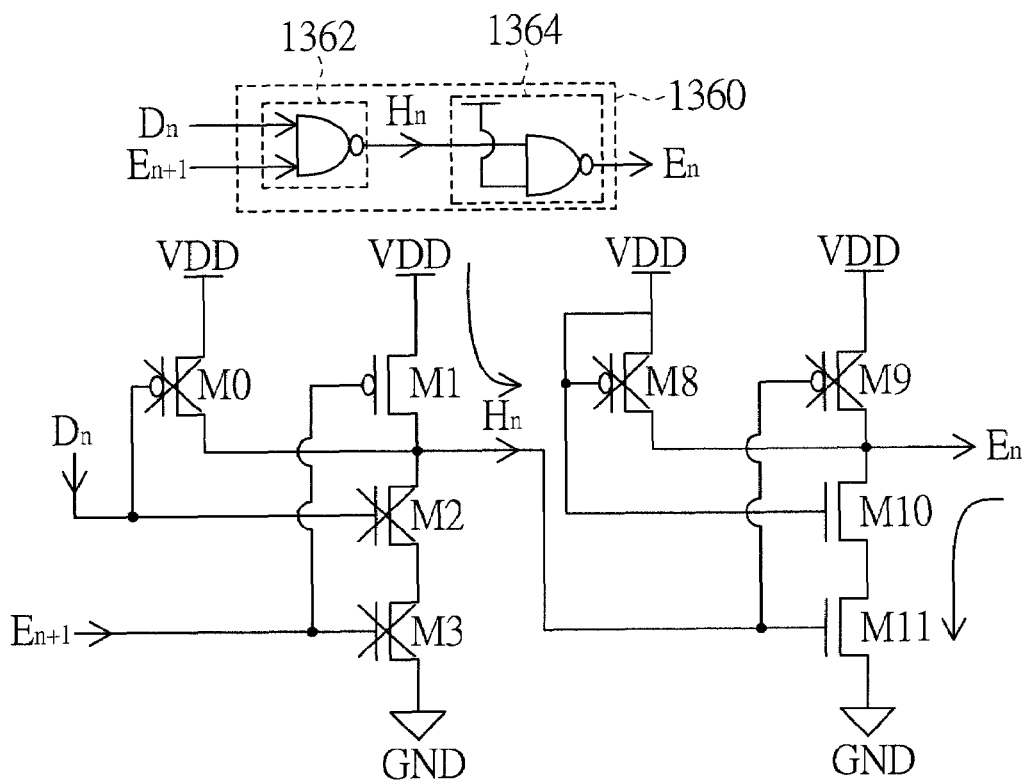
FIG. 15B is another example of the backward delay unit and the on/off states of transistors thereof in propagation of the negative pulse.

For example, as shown in FIGS. 15A and 15B, the first forward-delay device 1322 is a first NAND2 gate for receiving the output clock Cn−1 of the previous stage of clock synchronizing unit 1310, the second forward-delay device 1324 is a second NAND2 gate connected to an output terminal of the first NAND2 gate and an operational voltage VDD for outputting the first delayed clock Cn, the first backward-delay device 1362 is a third NAND2 gate for receiving the mirror clock Dn, and the second backward-delay device 1364 is a fourth NAND2 gate connected to an output terminal of the third NAND2 gate and the operational voltage VDD for outputting the corresponding output clock En.

Thus, the delay time t1 of the output clock Gn relative to the clock Cn−1 is a gate delay of the 2 serial-connected NMOS transistors M2 and M3, and the delay time t2 of the clock Cn relative to the clock Gn is a gate delay of the PMOS transistor M9. The delay time t3 of the output clock Hn relative to the clock En+1 is a gate delay of the equal to the delay time t4 of the PMOS transistor M1 and the delay time t4 is a gate delay of the 2 serial-connected PMOS transistors M10 and M11. As a result, the delay time t1 is still equal to the delay time t4, the delay time t2 is still equal to the delay time t3, and thus the propagation time of positive pulse is still the same as the propagation time of negative pulse. As long as the third delay time t3 is substantially equal to the second delay time t2 and the fourth delay time t4 is substantially equal to the first delay time t1 to achieve the purpose of clock synchronizing, all the alternatives are not apart from the scope of the invention.

Besides, although the mirror control unit 1340 is exemplified to be an NAND2 gate in the second embodiment, the mirror control unit 1340 of the invention can also have other structure, such as the circuit structure of the mirror control unit 814 in the first embodiment as shown in FIG. 10 to achieve the clock synchronizing purpose even in the DDR application.

Embodiment Three

Figure 16:
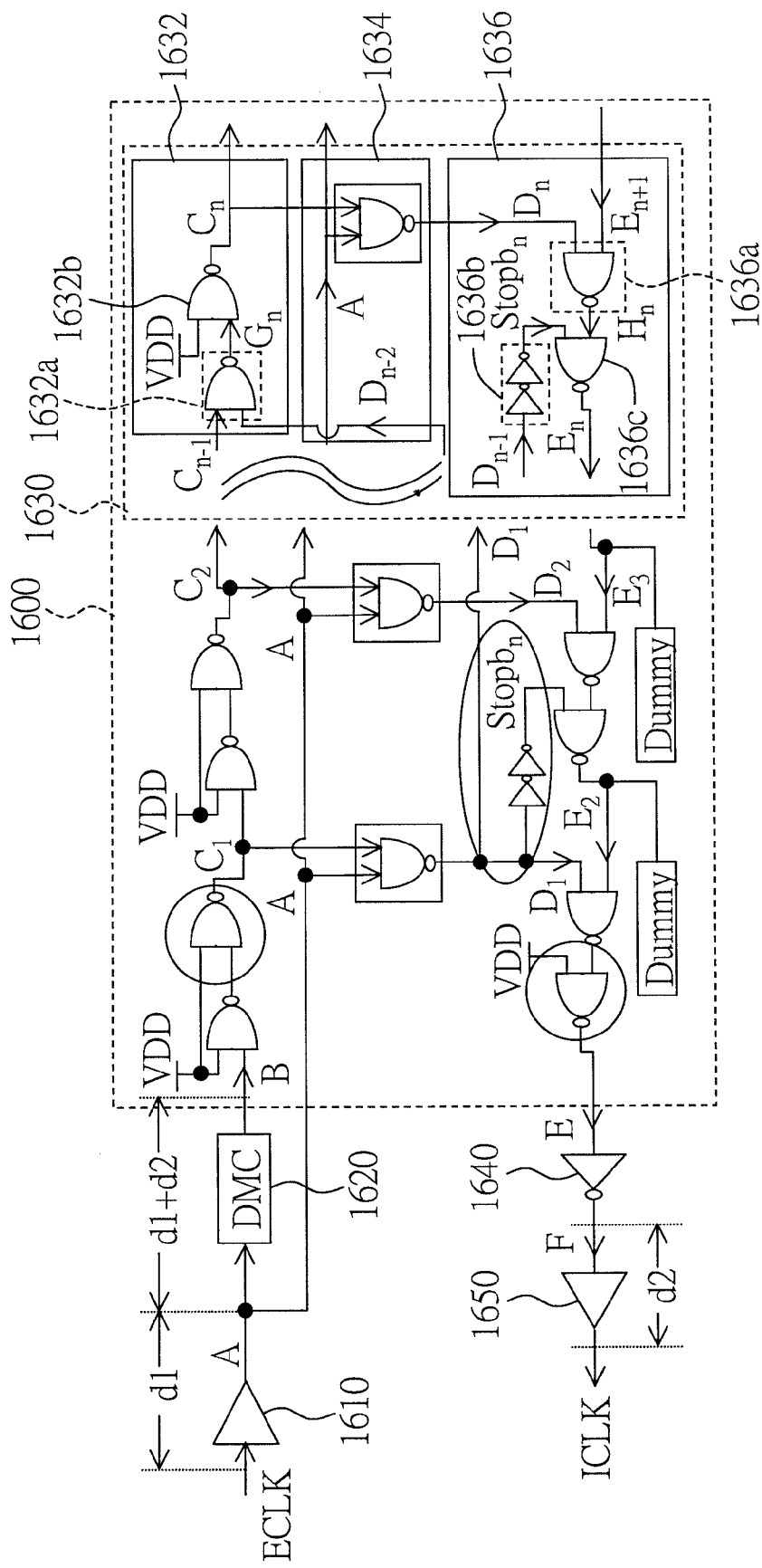
FIG. 16 is a block diagram of a clock synchronizing circuit according to the third embodiment of the invention.

Referring to FIG. 16, a block diagram of a clock synchronizing circuit according to the third embodiment of the invention is shown. The clock synchronizing circuit 1600 is applied in a SMD block for receiving an input clock A from an input buffer 1610. The input buffer 1610 outputs the clock A by a delay time d1 according to an external clock ECLK, and a DMC 1620 of the SMD block delays the clock A by a delay time (d1+d2) to generate a clock B. The clock synchronizing circuit 1600 includes a number of stages of clock synchronizing units 1630. The n-th stage of clock synchronizing units 1630 is used for outputting an output clock En according to the input clock A and an output clock En+1 of the (n+1)-th stage of clock synchronizing unit 1630, wherein n is a natural number. The first stage of clock synchronizing unit 1630 receives the clocks A, B and outputs an output clock E, which is further converted to a clock F through an inverter 1640. The clock F is then inputted to a clock driver 1650 and delayed by a time d2 to generate an internal clock ICLK.

Each clock synchronizing unit 1630 includes a forward delay unit 1632, a mirror control unit 1634 and a backward delay unit 1636. The n-th stage of forward delay unit 1632 is used for outputting a first delayed clock Cn according to an output clock Cn−1 of the (n−1)-th stage of forward delay unit 1632 and a mirror clock Dn−2 of the (n−2)-th stage of mirror control unit 1634. The forward delay unit 1632 includes a forward-delay device 1632a and a first NAND2 gate 1632b. The forward-delay device 1632a, such as an NAND2 gate, is used for delaying the output clock Cn−1 to a forward-delayed clock Gn. The first NAND2 gate 1632b is coupled to the forward-delay device 1632a for outputting the first delayed clock Cn according to the forward-delayed clock Gn and the operational voltage VDD.

The n-th stage of mirror control unit 1634, such as an NAND2 gate, is coupled to the first NAND2 gate 1632b for outputting a mirror clock Dn according to the input clock A and the first delayed clock Cn. Once the level of the clock Dn goes low (i.e. "0"), the forward-delay device 1632a (NAND2 gate) of the (n+2)-th stage of forward delay unit 1632 outputs a clock with a high level (i.e. "1") according to the high-level clock Cn+1 ("1") and the low-level clock Dn ("0"), and the NAND2 gate 1632b outputs the clock Cn+2 with a low level (i.e. "0") according to the high-level clock Gn+2 outputted by the forward-delay device 1632a and the operational voltage VDD. In other words, the clock Cn+2 will be stopped generating the positive pulse as the level of the clock Dn goes low.

The n-th stage of backward delay unit 1636 is coupled to the n-th stage of mirror control unit 1634 for outputting the corresponding output clock En according to the mirror clock Dn and the output clock En+1 of the (n+1)-th stage of the backward delay unit 1636, wherein the first stage of backward delay unit 1636 outputs the clock E. The backward delay unit 1636 includes a first backward-delay device 1636a, a second backward-delay device 1636b and a second NAND2 gate 1636c. The first backward-delay device 1636a, such as an NAND2 gate, is used for delaying the mirror clock Dn to a backward-delayed clock Hn according to the clock En+1.

The second backward-delay device 1636b, such as including two serial-connected inverters, is used for delaying a phase of the mirror clock Dn−1 of the (n−1)-th stage of mirror control unit 1634 to generate a stop signal Stopbn. The second NAND2 gate 1636c is coupled to the first backward-delay device 1636a for outputting the corresponding output clock En according to the backward-delayed clock Hn and the stop signal Stopbn.

Figure 17:
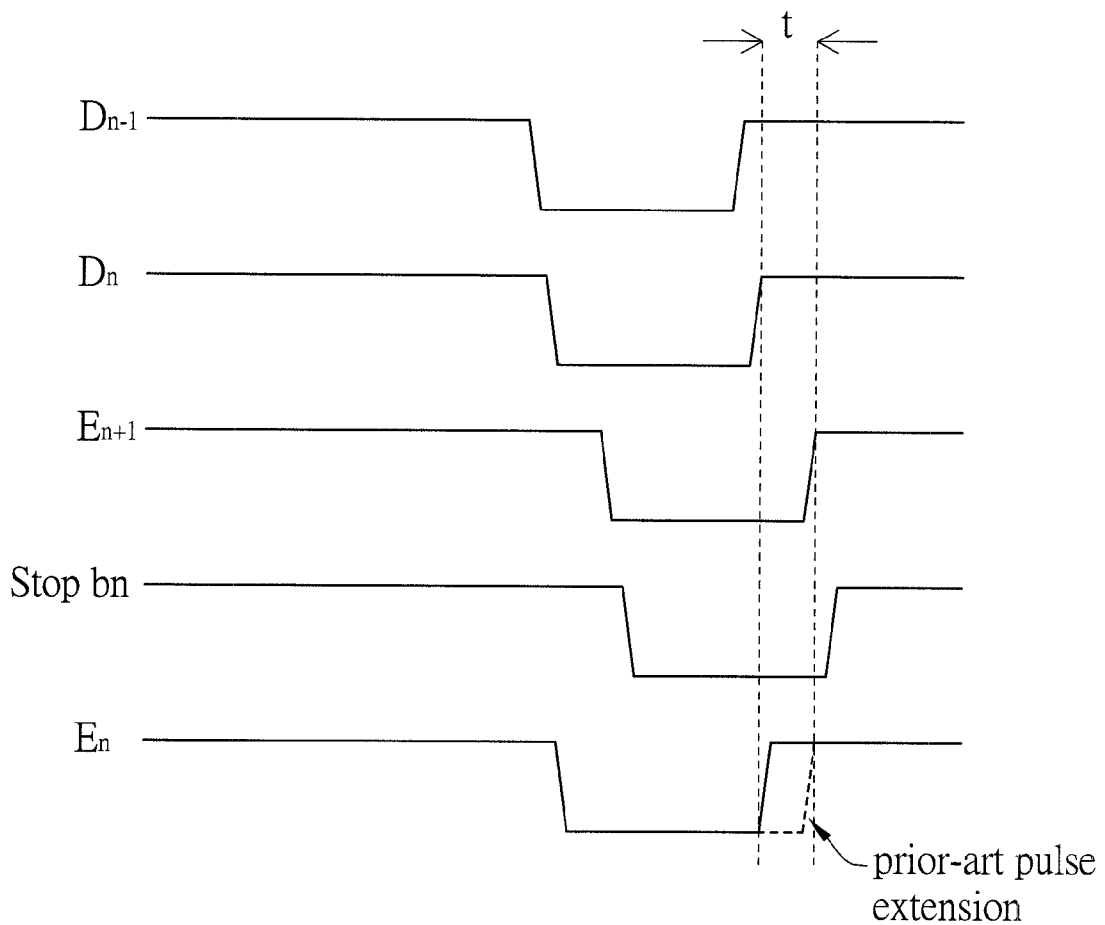
FIG. 17 is a timing diagram of the clocks Dn−1, Dn, En, En+1 and stop signal Stopbn in the backward delay unit of FIG. 16.

Referring to FIG. 17, a timing diagram of the clocks Dn−1, Dn, En, En+1 and stop signal Stopbn in the backward delay unit 1636 of FIG. 16 is shown. In the timing period t when the clock Dn goes high from a low level and the clock En+1 keeps at the low level, owing that the stop signal Stopbn is a delayed signal of the clock Dn−1, the stop signal Stopbn has the low level, and as a result, the clock En outputted by the NAND2 gate 1636c according to the low-level stop signal Stopbn has a high level. Therefore, different from the n-th stage of prior-art BDA 108 whose negative pulse En is the combination of the negative pulses Dn and En+1, leading to a negative-pulse extension, the output clock En of the n-th clock synchronizing circuit 1630 has no negative pulse extension, and thus the third issue of causing an error operation in the DDR application due to the negative-pulse extension can be effectively resolved.

Figure 18:
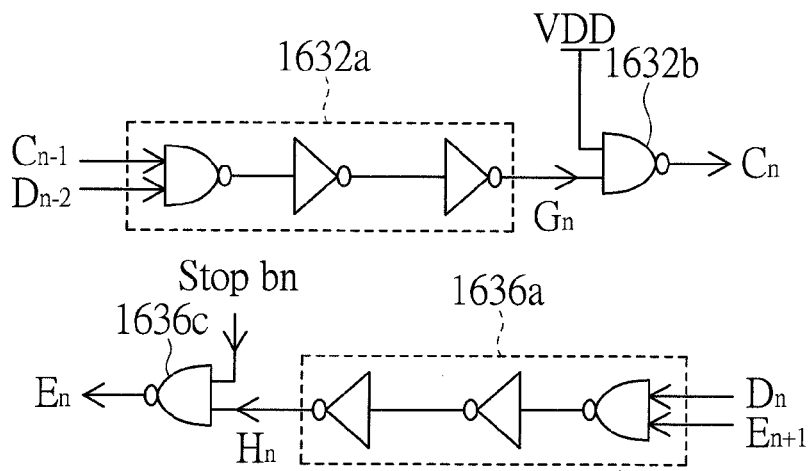
FIG. 18 is another example of the forward delay unit and backward delay unit in FIG. 16.

Although the forward-delay device 1632a and the backward-delay device 1636a are both exemplified to NAND2 gates in the third embodiment, the forward-delay device 1632a can also include a third NAND2 gate for receiving the clocks Cn−1 and Dn−2, a first inverter connected to an output terminal of the third NAND2 gate, a second inverter connected to the first inverter in series for outputting the forward-delayed clock Gn, and the first backward-delay device comprises a fourth NAND2 gate for receiving the clocks Dn and En+1, a third inverter connected to an output terminal of the fourth NAND2 gate and a fourth inverter connected to the third inverter in series for outputting the backward-delayed clock Hn as shown in FIG. 18.

Besides, although the mirror control unit 1634 is exemplified to be an NAND2 gate in the third embodiment, the mirror control unit 1634 of the invention can also have other structure, such as the circuit structure of the mirror control unit 814 in the first embodiment as shown in FIG. 10 to achieve the clock synchronizing purpose even in the DDR application.

Embodiment Four

Figure 19:
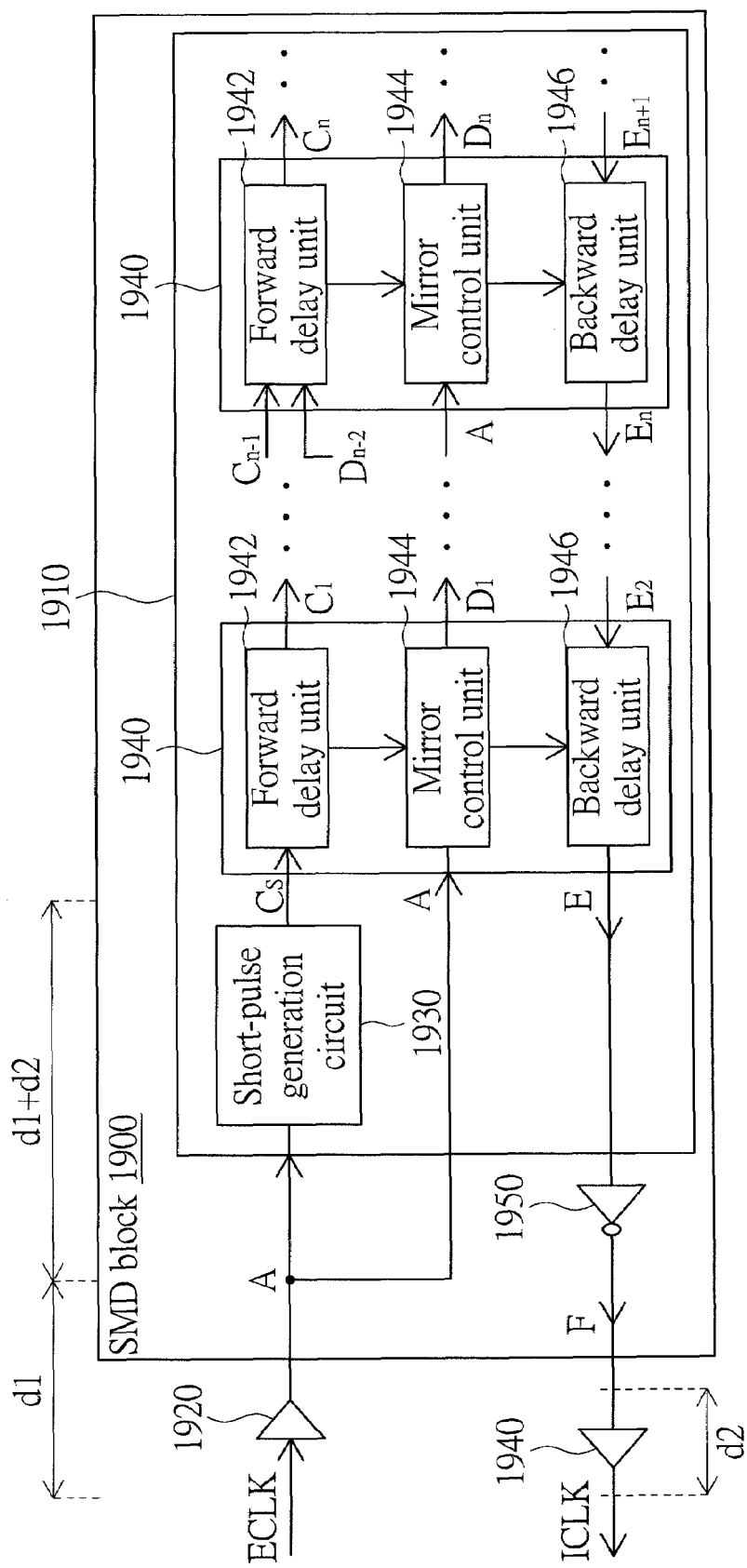
FIG. 19 is a block diagram of a clock synchronizing circuit according to the fourth embodiment of the invention.

Referring to FIG. 19, a block diagram of a clock synchronizing circuit according to the fourth embodiment of the invention is shown. A clock synchronizing circuit 1910 is applied in a SMD block 1900 for receiving an input clock A from an input buffer 1920. The input buffer 1920 outputs the clock A by a delay time d1 according to an external clock ECLK. The clock synchronizing circuit 810 includes a short-pulse generation circuit 1930 and a number of stages of clock synchronizing units 1940. The short-pulse generation circuit 1930 is used for outputting a short-pulse clock Cs according to the input clock A, and the clock Cs is delayed by a time (d1+d2) relative to the clock A. The pulse-width of the short-pulse clock Cs is much smaller than the pulse-width of the input clock A.

The n-th stage of clock synchronizing unit 1940 is used for outputting an output clock En according to the input clock A and an output clock En+1 of the (n+1)-th stage of clock synchronizing unit 1940, wherein n is a natural number. The first stage of clock synchronizing unit 1940 receives the clocks A, Cs and outputs a clock E, which is further converted to a clock F through an inverter 1950. The clock F is then inputted to a clock driver 1960 and delayed by a time d2 to generate an internal clock ICLK.

Each clock synchronizing unit 1940 includes a forward delay unit 1942, a mirror control unit 1944 and a backward delay unit 1946. The n-th stage of forward delay unit 1942 is used for outputting a first delayed clock Cn according to the first delayed clock Cn−1 of the (n−1)-th stage of forward delay unit 1942 and a mirror clock Dn−2 of the (n−2)-th stage of mirror control unit 1944. The n-th stage of mirror control unit 1944 is coupled to the n-th stage of forward delay unit 1942 for outputting a mirror clock Dn according to the input clock A and the first delayed clock Cn. The n-th stage of backward delay unit 1946 is coupled to the n-th stage mirror control unit 1944 for delaying the mirror clock Dn to the corresponding output clock En according to the output clock En+1 of the (n+1)-th stage of backward delay unit 1946.

For example, the forward delay unit 1942 and the backward delay unit 1946 can be respectively the forward delay unit 812 and the backward delay unit 816 of the first embodiment or be respectively the forward delay unit 1320 and the backward delay unit 1360 of the second embodiment, or be respectively the forward delay unit 1632 and the backward delay unit 1636 of the third embodiment. The mirror control unit 1944 can be the mirror control unit 814 as shown in FIG. 10 of the first embodiment or the mirror control unit 1340 of the second embodiment.

Figure 20:
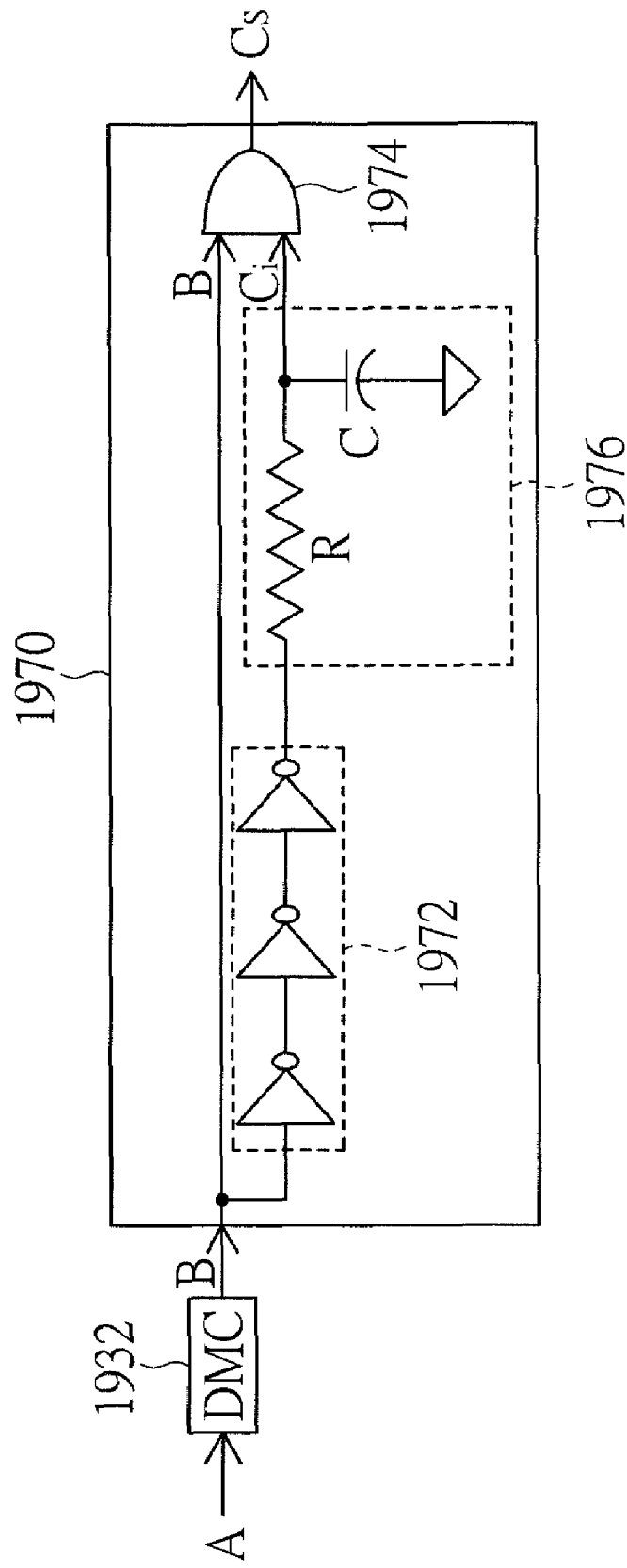
FIG. 20 is a circuit diagram of the short-pulse generation circuit of FIG. 19.

Referring to FIG. 20, a circuit diagram of the short-pulse generation circuit 1930 of FIG. 19 is shown. The short-pulse generation circuit 1930 includes a DMC 1932 and a short-pulse generator 1970. The DMC is used for outputting a delay-monitor clock B according to the input clock A. The short-pulse generator 1970 is coupled to the DMC 1932 for outputting the short-pulse clock Cs according to the delay-monitor clock B. The short-pulse generator 1970 includes N inverters 1972, an AND gate 1974 and a RC circuit 1976. The N inverters 1972 are coupled in series to the DMC 1932 for outputting a phase-inverted clock Ci through the RC circuit 1976 according to the delay-monitor clock B, wherein N is an odd number, N≧3, and N=3 in the fourth embodiment. The AND gate 1974 is coupled to the DMC and the N converters through the RC circuit 1976 for performing an AND gate operation on the delay-monitor clock B and the phase-inverted clock Ci and accordingly outputting the short-pulse clock Cs.

Figure 21:
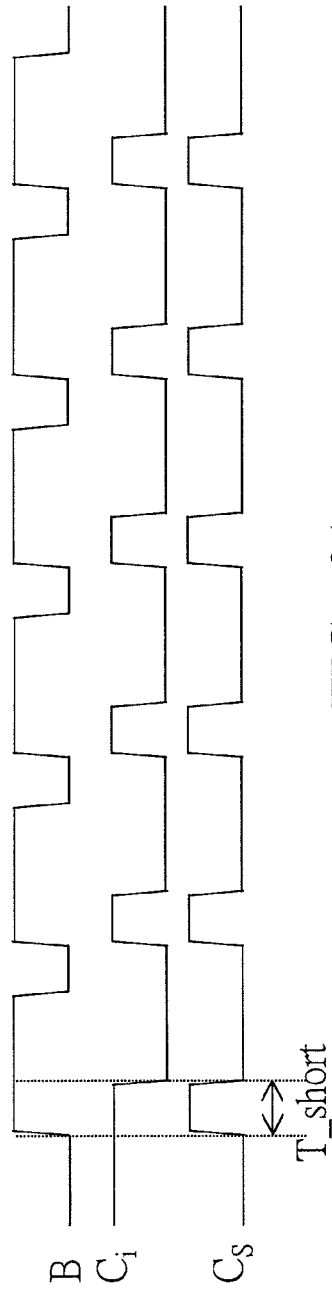
FIG. 21 is a timing diagram of the clocks B, Ci and Cs of the short-pulse generator in FIG. 20.
Figure 22:
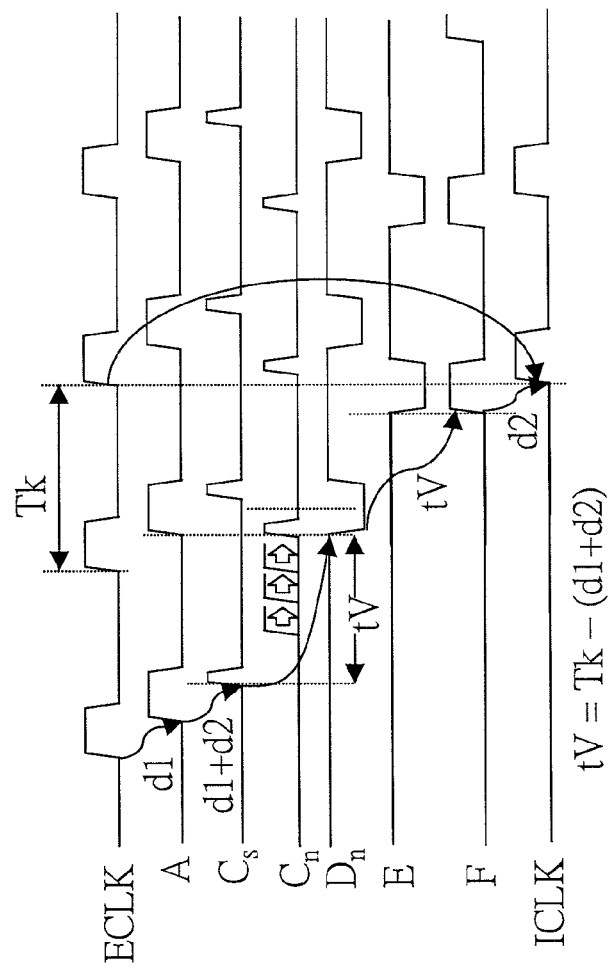
FIG. 22 is a timing diagram of the clocks ECLK, A, Cs, Cn, Dn, E, F and ICLK in the SMD block of FIG. 16.

Referring to FIG. 21, a timing diagram of the clocks B, Ci and Cs of the short-pulse generator 1970 in FIG. 20 is shown. The clock Ci is delayed by the N inverters 1972 as well as the RC circuit 1976 by a time T-short. Thus, the output clock Cs of the AND gate 1974 has a short pulse having a pulse-width equal to T-short. As shown in FIG. 22, owing that the clock Cs has a short pulse-width, the clock Cn generated by the forward delay unit 1942 also has the short pulse-width. As a result, the propagation time of the positive pulse, i.e. the delay time of the clock Cn relative to the clock Cs, is substantially equal to the delay time tv of the clock Dn relative to the clock Cs, and the propagation time of the negative pulse, i.e. the delay time of the clock E relative to the clock Dn is also substantial equal to the delay time tv. When the time tv is controlled to be (Tk-d1-d2), wherein Tk is a clock period of the external clock ECLK, the internal clock ICLK will be delayed by the time (d1+(d1+d2)+tv+tv+d2)=2(d1+d2+tv) =2Tk relative to the external clock ECLK. Therefore, the time t-miss in the fifth issue of the prior-art clock synchronizing circuit can be eliminated to achieve the purpose of clock synchronizing.

Figure 23:
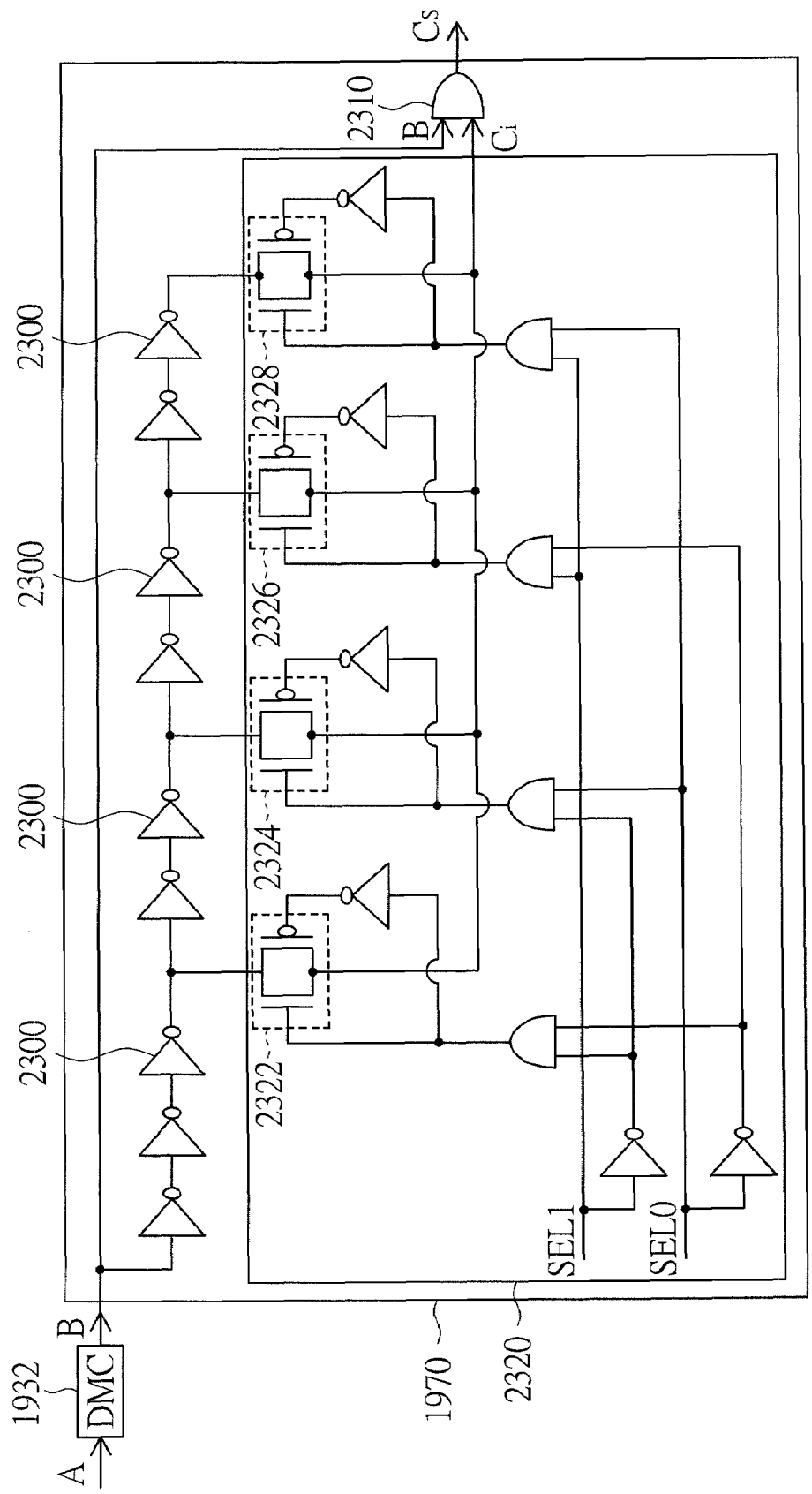
FIG. 23 is another example of the short-pulse generator in FIG. 20.

Although the short-pulse generator 1970 is exemplified to include the N inverters 1972, the AND gate 1974 and the RC circuit 1976 in the fourth embodiment, the short-pulse generator 1970 of the invention can also include N inverters 2300, an AND gate 2310 and a selection circuit 2320 as shown in FIG. 23, wherein N is an odd number, N≧3 and N=9 in the embodiment. The N inverters 2300 are coupled in series to the clock B. The selection circuit 2320 is coupled to the N inverters 2300 for selectively outputting the phase-inverted clock Ci according to the delay-monitor clock B via M inverters of the N inverters 2300, wherein M is an odd number and M≦N, M=3, 5, 7 or 9.

The selection circuit 2320 includes four switching devices 2322, 2324, 2326 and 2328. When the signals (SEL1, SEL0) are ("1", "1"), the switching devices 2322, 2324 and 2326 are turned off, the switching device 2328 is turned on, and thus the clock Ci is delayed by 9 (M=9) inverters 2300. When the signals (SEL1, SEL0) are ("1", "0"), the switching devices 2322, 2324 and 2328 are turned off, the switching device 2326 is turned on, and thus the clock Ci is delayed by 7 (M=7) inverters 2300. When the signals (SEL1, SEL0) are ("0", "1"), the switching devices 2322, 2326 and 2328 are turned off, the switching device 2324 is turned on, and thus the clock Ci is delayed by 5 (M=5) inverters 2300. When the signals (SEL1, SEL0) are ("0", "0"), the switching devices 2324, 2326 and 2328 are turned off, the switching device 2322 is turned on, and thus the clock Ci is delayed by 3 (M=3) inverters 2300. The AND gate 2310 outputs the clock Cs according to the clock B and the clock Ci, and thus the pulse-width T-short of the clock Ci can be a sum of delay time of the M(=3, 5, 7 or 9) inverters 2300.

Figure 24:
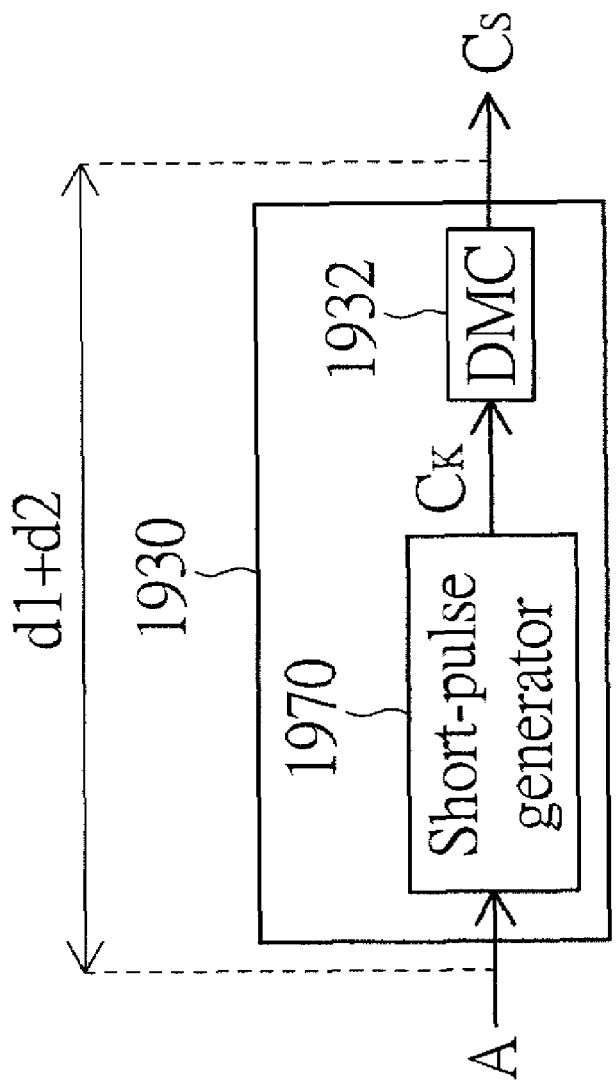
FIG. 24 is another example of the short-pulse generation circuit in FIG. 19.

Although the short-circuit generation circuit 1930 is exemplified to include the DMC 1932 and the short-pulse generator 1970 with the short-pulse generator 1970 coupled between the DMC 1932 and the clock synchronizing unit 1940 in the fourth embodiment, the short-circuit generation circuit 1930 of the invention can also include the short-pulse generator 1970 outputting an initial short-pulse clock Ck according to the input clock A and the DMC 1932 for delaying the initial short-pulse clock Ck to generate the short-pulse clock Cs whose phase is delayed by the time (d1+d2) relative to the clock A as shown in FIG. 24. As long as the clock synchronizing circuit including a short-pulse generation circuit for generating a short pulse with a pulse-width much smaller than that of the input clock A to achieve the purpose of clock synchronizing, all the alternatives are not apart from the scope of the invention.

The clock synchronizing circuit disclosed by the above four embodiments of the invention has the following advantages:

(1) By using the circuit structure of the mirror control unit 814 of the first embodiment, the clock Dn can have the same duty cycle as the input clock A, and as a result, the internal clock ICLK has the same duty cycle as the external clock ECLK. Therefore, the error operation of the conventional SMD block in the DDR application can be prevented to achieve more precise clock synchronizing.

(2) By using the stagger-type forward delay unit and backward delay unit of the second embodiment, the delay time of the clock Cn relative to the clock Cn−1 is the same as the delay time (t3+t4) of the clock En relative to the clock En+1, and as a result, the delay time of the clock Dn relative to the clock B (propagation time of the positive pulse) is the same as the delay time of the clock E relative to the clock Dn (propagation time of the negative pulse). Therefore, the clock synchronizing circuit of the invention can achieve more precise clock synchronizing as compared to the prior art.

(3) By using the circuit structure of the forward delay unit 1632 and the backward delay unit 1636 in the third embodiment, the stop signal Stopbn can be generated by a period of delay time relative to the clock Dn−1 to eliminate the negative pulse extension of the output clock En. Therefore, the error operation of the conventional SMD block in the DDR application can be prevented to achieve more precise clock synchronizing.

(4) By using the short-pulse generation circuit 1930 of the fourth embodiment to generate a short pulse Cs with a pulse-width much smaller than that of the input clock A, the clock Cn will also has the same small pulse-width, and thus the propagation time of the positive pulse and the propagation time of the negative pulse are both substantially equal to the delay time of the clock Dn relative to the clock Cs. Therefore, the clock synchronizing circuit of the invention can achieve more precise clock synchronizing as compared to the prior art.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A clock synchronizing circuit, applied in a synchronous mirror delay (SMD) block for receiving an input clock, the clock synchronizing circuit comprising:

a plurality of stages of clock synchronizing units, each of the clock synchronizing units used for outputting an output clock according to the input clock and an output clock of a next stage of clock synchronizing unit, each clock synchronizing unit comprising:

a forward delay unit, for outputting a first delayed clock;

a mirror control unit, coupled to the forward delay unit, for outputting a mirror clock according to the input clock and the first delayed clock, the mirror control unit comprising:
- a first mirror-control device, for outputting a first mirror-controlled clock according to the input clock;
- a second mirror-control device, for outputting a second mirror-controlled clock according to the first delayed clock; and
- a third mirror-control device, coupled to the first mirror-control device and the second mirror-control device for outputting the mirror clock according to the input clock, the first mirror-controlled clock and the second mirror-controlled clock; and a backward delay unit, coupled to the mirror control unit for delaying the mirror clock to the corresponding output clock;

wherein in a first timing period when the input clock has a first level and the first delayed clock has a second level, the first mirror-controlled clock has the second level, the second mirror-controlled clock has the first level and the mirror clock has the second level.

2. The clock synchronizing circuit according to claim 1, wherein in a second timing period when both of the input clock and the first delayed clock have the second level, all of the first mirror-controlled clock, the second mirror-controlled clock and the mirror clock have the first level; in a third timing period when the input clock has the second level and the first delayed clock has the first level, the first mirror-controlled clock has the first level, the second mirror-controlled clock has the second level and the mirror clock has the first level; in a fourth timing period when both of the input clock and the first delayed clock have the first level, all of the first mirror-controlled clock, the second mirror-controlled clock and the mirror clock have the second level.

3. The clock synchronizing circuit according to claim 1, wherein in a first previous timing period when the input clock has the second level and the first delayed clock has the first level, the mirror clock has the second level, in a second previous timing period when the input clock has the second level and the first delayed clock has the second level, the mirror clock has the second level, and in a third previous timing period when the input clock has the first level and the first delayed clock has the second level, the mirror clock has the second level.

4. The clock synchronizing circuit according to claim 1, wherein the first mirror-control device comprises a first inverter for outputting the first mirror-controlled clock according to the input clock.

5. The clock synchronizing circuit according to claim 4, wherein the second mirror-control device comprises a second inverter coupled to the first inverter in series for outputting the mirror-controlled clock according to the first delayed clock.

6. The clock synchronizing circuit according to claim 5, wherein the third mirror-control device comprises:
- a first metal oxide semiconductor (MOS) transistor comprising a gate receiving the second mirror-controlled clock and a source receiving the first mirror-controlled clock;
- a second MOS transistor comprising a gate connected to the gate of the first MOS transistor and a source grounded;
- a third MOS transistor comprising a source connected to a drain of the first MOS transistor and a drain connected to a drain of the second MOS transistor;
- a fourth MOS transistor comprising a gate connected to a gate of the third MOS transistor for receiving the input clock and a drain for outputting the mirror clock;
- a fifth MOS transistor comprising a gate connected to the gate of the third MOS transistor and a drain connected to the drain of the fourth MOS transistor; and
- a sixth MOS transistor comprising a gate connected to the drain of the second MOS transistor and a drain connected to a source of the fifth MOS transistor.

7. A clock synchronizing circuit, applied in a SMD block for receiving an input clock, the clock synchronizing circuit comprising:
a plurality of stages of clock synchronizing units, each of the clock synchronizing units used for outputting an output clock according to the input clock and an output clock of a next stage of clock synchronizing unit, each clock synchronizing unit comprising:
a forward delay unit, for outputting a first delayed clock according to a forward clock, wherein the forward clock in any of the stages of synchronizing units other than a first stage is the first delayed clock of a previous stage of forward delay unit, the forward delay unit comprising:
- a first forward-delay device, for delaying the forward clock to a forward-delayed clock by a first delay time; and
- a second forward-delay device, coupled to the first forward-delay device for delaying the forward-delayed clock to the first delayed clock by a second delay time;

a mirror control unit, coupled to the second forward-delay device for outputting a mirror clock according to the input clock and the first delayed clock; and a backward delay unit, coupled to the mirror control unit for outputting the corresponding output clock according to the mirror clock, the backward delay unit comprising:
- a first backward-delay device, for delaying the mirror clock to a backward-delayed clock by a third delay time, wherein the third delay time is substantially equal to the second delay time; and
a second backward-delay device, coupled to the first backward-delay device for delaying the backward-delayed clock to the corresponding output clock by a fourth delay time, wherein the fourth delay time is substantially equal to the first delay time, and the second backward-delay device has an input terminal coupled to an operational voltage.

8. The clock synchronizing circuit according to claim 7, wherein the first forward-delay device is a first NAND2 gate for receiving the forward clock, the second forward-delay device is a second NAND2 gate connected to an output terminal of the first NAND2 gate and the operational voltage for outputting the first delayed clock, the first backward-delay device is a third NAND2 gate for receiving the mirror clock, and the second backward-delay device is a fourth NAND2 gate connected to an output terminal of the third NAND2 gate and the operational voltage for outputting the corresponding output clock.

9. The clock synchronizing circuit according to claim 7, wherein the first forward-delay device comprises a first NAND2 gate for receiving the forward clock, and a first inverter connected to an output terminal of the first NAND2 gate, the second forward-delay device comprises a second inverter connected to an output terminal of the first inverter and a second NAND2 gate connected to an output terminal of the second inverter and an operational voltage for outputting the first delayed clock, the first backward-delay device comprises a third NAND2 gate for receiving the mirror clock, and a third inverter connected to an output terminal of the third NAND2 gate, the second backward-delay device comprises a fourth inverter connected to an output terminal of the third converter and a fourth NAND2 gate connected to an output terminal of the fourth inverter and the operational voltage for outputting the corresponding output clock.

10. The clock synchronizing circuit according to claim 7, wherein the mirror control circuit comprises an NAND2 gate for outputting the mirror clock according to the input clock and the first delayed clock.

11. The clock synchronizing circuit according to claim 7, wherein the mirror control circuit comprises:
   a first inverter, for outputting a first phase-inverted clock according to the input clock;
   a second inverter, for outputting a second phase-inverted clock according to the first delayed clock;
   a first MOS transistor comprising a gate receiving the second phase-inverted clock and a source receiving the first phase-inverted clock;
   a second MOS transistor comprising a gate connected to the gate of the first MOS transistor and a source grounded;
   a third MOS transistor comprising a source connected to a drain of the first MOS transistor and a drain connected to a drain of the second MOS transistor;
   a fourth MOS transistor comprising a gate connected to a gate of the third MOS transistor and a drain for outputting the mirror clock;
   a fifth MOS transistor comprising a gate connected to the gate of the third MOS transistor and a drain connected to the drain of the fourth MOS transistor; and
   a sixth MOS transistor comprising a gate connected to the drain of the second MOS transistor and a drain connect to a source of the fifth MOS transistor.

12. The clock synchronizing circuit according to claim 7, further comprising a short-pulse generation circuit for outputting a short-pulse clock according to the input clock, wherein the pulse-width of the short-pulse clock is much smaller than the pulse-width of the input clock.

13. A clock synchronizing circuit, applied in a SMD block which receives an input clock, the clock synchronizing circuit comprising:
   a plurality of clock synchronizing units, each of the clock synchronizing units used for outputting an output clock according to the input clock and an output clock of a next stage of clock synchronizing unit, each clock synchronizing unit comprising:
      a forward delay unit for outputting a first delayed clock according to a forward clock, wherein the forward clock in any of the stages of synchronizing units other than a first stage is the first delayed clock of a previous stage of forward delay unit, the forward delay unit comprising:
         a forward-delay device, for delaying the forward clock to a forward-delayed clock; and
         a first NAND2 gate, coupled to the forward-delay device for outputting the first delayed clock according to the forward-delayed clock;
      a mirror control unit, coupled to the first NAND2 gate for outputting a mirror clock according to the input clock and the first delayed clock; and
      a backward delay unit, coupled to the mirror control unit for outputting the corresponding output clock according to the mirror clock, the backward delay unit comprising:
         a first backward-delay device, for delaying the mirror clock to a backward-delayed clock;
         a second backward-delay device, for delaying a phase of a backward clock to generate a stop signal, wherein the backward clock in any of the stages of synchronizing units other than the first stage is the mirror clock of a previous stage of mirror control unit; and
         a second NAND2 gate, coupled to the first backward-delay device for outputting the corresponding output clock according to the backward-delayed clock and the stop signal.

14. The clock synchronizing circuit according to claim 13, wherein the second backward-delay device comprises two serial-connected inverters for outputting the stop signal according to the backward clock.

15. The clock synchronizing circuit according to claim 13, wherein the forward-delay device comprises a third NAND2 gate coupled to the first NAND2 gate in series for receiving the forward clock, and the first backward-delay device comprises a fourth NAND2 gate coupled to the second NAND2 gate in series for receiving the mirror clock.

16. The clock synchronizing circuit according to claim 13, wherein the forward-delay device comprises a third NAND2 gate for receiving the forward clock, a first inverter connected to an output terminal of the third NAND2 gate, a second inverter connected to the first inverter in series for outputting the forward-delayed clock, and the first backward-delay device comprises a fourth NAND2 gate for receiving the mirror clock, a third inverter connected to an output terminal of the fourth NAND2 gate and a fourth inverter connected to the third inverter in series for outputting the backward-delayed clock.

17. The clock synchronizing circuit according to claim 13, wherein the mirror control circuit comprises:
   a first inverter, for outputting a first phase-inverted clock according to the input clock;
   a second inverter, for outputting a second phase-inverted clock according to the first delayed clock; and
   a first MOS transistor comprising a gate receiving the second phase-inverted clock and a source receiving the first phase-inverted clock;
   a second MOS transistor comprising a gate connected to the gate of the first MOS transistor and a source grounded;
   a third MOS transistor comprising a source connected to a drain of the first MOS transistor and a drain connected to a drain of the second MOS transistor;
   a fourth MOS transistor comprising a gate connected to a gate of the third MOS transistor and a drain for outputting the mirror clock;
   a fifth MOS transistor comprising a gate connected to the gate of the third MOS transistor and a drain connected to the drain of the fourth MOS transistor; and
   a sixth MOS transistor comprising a gate connected to the drain of the second MOS transistor and a drain connect to a source of the fifth MOS transistor.

18. The clock synchronizing circuit according to claim 13, further comprising a short-pulse generation circuit for outputting a short-pulse clock according to the input clock, wherein the pulse-width of the short-pulse clock is much smaller than the pulse-width of the input clock.

19. A clock synchronizing circuit, applied in a SMD block for receiving an input clock, the clock synchronizing circuit comprising:
- a short-pulse generation circuit, for outputting a short-pulse clock according to the input clock, wherein the pulse-width of the short-pulse clock is much smaller than the pulse-width of the input clock;
- a plurality of stages of clock synchronizing units, each of the clock synchronizing units used for outputting an output clock according to the input clock and an output clock of a next stage of clock synchronizing unit, a first stage of clock synchronizing unit receiving the short-pulse clock, each clock synchronizing unit comprising:
    - a forward delay unit, for outputting a first delayed clock;
    - a mirror control unit, coupled to the forward delay unit, for outputting a mirror clock according to the input clock and the first delayed clock; and
    - a backward delay unit, coupled to the mirror control unit for delaying the mirror clock to the corresponding output clock.

20. The clock synchronizing circuit according to claim 19, wherein the short-pulse generation circuit comprises:
- a delay monitor circuit (DMC), for outputting a delay-monitor clock according to the input clock; and
- a short-pulse generator, coupled to the DMC for outputting the short-pulse clock according to the delay-monitor clock, the short-pulse generator comprising:
    - N inverters, coupled in series to the DMC for outputting a phase-inverted clock according to the delay-monitor clock, wherein N is an odd number, $N \geq 3$; and
    - an AND gate, coupled to the DMC and the N converters for performing an AND gate operation on the delay-monitor clock and the phase-inverted clock and accordingly outputting the short-pulse clock.

21. The clock synchronizing circuit according to claim 20, wherein the short-pulse generator further comprises a RC circuit coupled between the N inverters and the AND gate.

22. The clock synchronizing circuit according to claim 20, wherein the short-pulse generator further comprises a selection circuit coupled to the N inverters for selectively outputting the phase-inverted clock according to the delay-monitor clock via M inverters of the N inverters, wherein M is an odd number and $M \leq N$.

23. The clock synchronizing circuit according to claim 19, wherein the short-pulse generation circuit comprises:
- a short-pulse generator, for outputting an initial short-pulse clock according to the input clock, the short-pulse generator comprising:
    - N inverters, coupled in series for outputting a phase-inverted clock according to the input clock, wherein N is an odd number, $N \geq 3$; and
    - an AND gate, coupled to the N converters for performing an AND gate operation on the input clock and the phase-inverted clock and accordingly outputting the initial short-pulse clock; and
- a DMC, for delaying the initial short-pulse clock to generate the short-pulse clock.

24. The clock synchronizing circuit according to claim 23, wherein the short-pulse generator further comprises a RC circuit coupled between the N inverters and the AND gate.

25. The clock synchronizing circuit according to claim 23, wherein the short-pulse generator further comprises a selection circuit coupled to the N inverters for selectively outputting the phase-inverted clock according to the input clock via M inverters of the N inverters, wherein M is an odd number and M N.

* * * * *